(12) United States Patent
Ishida et al.

(10) Patent No.: US 6,476,899 B2
(45) Date of Patent: Nov. 5, 2002

(54) DISPLAY PANEL AND METHOD OF PRODUCING THE SAME

(75) Inventors: Nobuhisa Ishida, Kyoto; Norihiro Agawa, Itami; Takamitsu Kakinaga, Kyoto, all of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/955,352

(22) Filed: Sep. 18, 2001

(65) Prior Publication Data

US 2002/0036746 A1 Mar. 28, 2002

(30) Foreign Application Priority Data

Sep. 28, 2000 (JP) ........................................ 2000-296035

(51) Int. Cl.$^7$ ............................................ G02F 1/1345
(52) U.S. Cl. ..................... 349/139; 349/143; 349/149; 349/150; 349/152
(58) Field of Search ................. 349/42, 149, 150–152, 349/143, 139

(56) References Cited

U.S. PATENT DOCUMENTS

| | | | | |
|---|---|---|---|---|
| 4,966,442 A | * | 10/1990 | Ono et al. ..................... 349/73 |
| 5,164,853 A | * | 11/1992 | Shimazaki .................. 349/155 |
| 5,657,104 A | * | 8/1997 | Kanezawa .................. 349/149 |
| 5,684,550 A | * | 11/1997 | Shibata et al. ................. 349/62 |
| 5,980,188 A | * | 11/1999 | Yoshida et al. ............. 349/113 |

FOREIGN PATENT DOCUMENTS

| | | | |
|---|---|---|---|
| JP | 08-194113 A | | 7/1996 |
| JP | 411015007 A | * | 1/1999 |

* cited by examiner

Primary Examiner—William L. Sikes
Assistant Examiner—Julie Ngo
(74) Attorney, Agent, or Firm—Sidley Austin Brown & Wood LLP

(57) ABSTRACT

Disclosed is a display panel including: a display layer for performing display; a flexible substrate for holding or carrying the display layer; a transparent electrode formed on the flexible substrate; and a metal film formed on the flexible substrate, electrically connected to the transparent electrode and made of a material different from that of the transparent electrode.

Also disclosed is a method of producing a display panel including the steps of: forming a transparent electrode of a predetermined form on a flexible substrate; forming a metal film of a predetermined form on the flexible substrate so that the metal film is electrically connected to the transparent electrode, the metal film being made of a material different from that of the transparent electrode; and holding or carrying a display layer with the flexible substrate carrying the transparent electrode and the metal film, the display layer being provided for performing display.

21 Claims, 13 Drawing Sheets

Fig.1 (A) FRONT SIDE
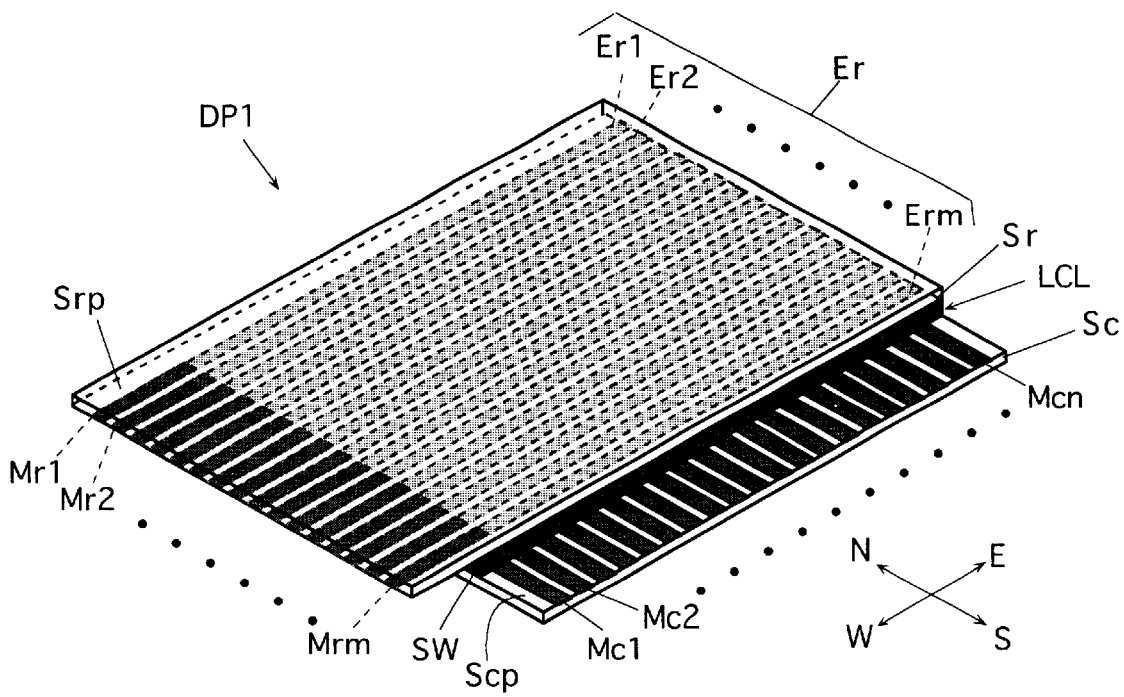
Fig.1 (B) BACK SIDE
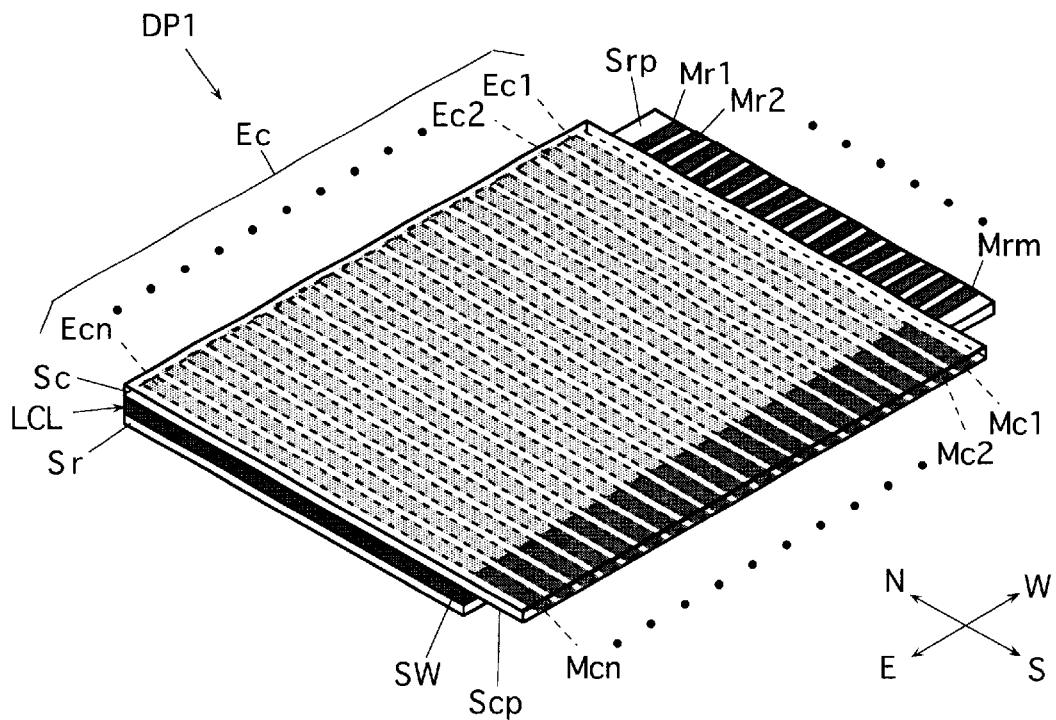

DISPLAY PANEL AND METHOD OF PRODUCING THE SAME

CROSS-REFERENCE TO RELATED APPLICATION

This application is based on Japanese Patent Application No.2000-296035 filed in Japan on Sep. 28, 2000, the entire content of which is hereby incorporated by reference.

BACKGROUND OF THE INVENTION

1. Field of the Invention

The present invention relates to a display panel such as a liquid crystal display (LCD) panel. Also, the invention relates to a method of producing a display panel.

2. Description of Related Art

In recent years, a display panel such as a liquid crystal display (LCD) panel, an electro-luminescence (EL) display panel and a plasma display panel (PDP) has been widely used instead of CRT.

The display panel has a display layer for performing display. The display layer is held between a pair of substrates, or is carried or held by single substrate. In the liquid crystal display panel, the display layer is a layer (liquid crystal layer) formed of liquid crystal, and is held between a pair of substrates. The substrates are usually formed of glass substrates, but are formed of resin substrates in some cases. The resin substrate is more resistant to breakage than the glass substrate.

In the display panel, transparent electrodes are formed on the opposite sides of the display layer for changing the state of the display layer to perform display. For example, a voltage is applied across the electrodes to change the state of the display layer, so that the display is performed. The electrodes are usually made of ITO.

The electrode on at least one side is usually formed on the substrate provided for holding or carrying the display layer. The electrode on the substrate is usually electrically connected to a drive element (e.g., drive IC) of a drive device, and a control portion of the drive device applies a voltage via the drive element to the electrode for driving the display panel.

The drive element is mounted directly on the substrate of the display panel in some cases, and is directly connected to the electrode on the display panel substrate. Instead of this, a drive substrate carrying a drive element is connected to the display panel substrate in some cases, so that the electrode on the display panel substrate is connected to the drive element on the drive substrate. The drive substrate carrying the drive element may be of a TCP (Tape Carrier Package) type in many cases.

In the display panel, the following problems may arise when the drive element such as drive IC is connected to the electrode on the display panel substrate.

In the case where the drive IC is directly mounted on the substrate of the display panel, breakage such as cracking may occur in the electrode in the operation of connecting a lead of the drive IC to the electrode with an anisotropic conductive adhesive such as ACF while applying a heat and a pressure during the connecting operation. Since ITO, which is often used as the material of the electrode, is fragile, the foregoing breakage is liable to occur in the ITO electrode. In particular, the breakage of the electrode is liable to occur in the structure in which the ITO electrode is formed on the resin substrate, compared with a structure in which the ITO electrode is formed on the glass substrate.

If the electrode is broken, and thereby the electrical connection between the electrode and the drive element is opened, it becomes difficult to drive the display panel for performing the display.

SUMMARY OF THE INVENTION

An object of the invention is to provide a display panel having a substrate provided with a transparent electrode, and particularly to provide the display panel in which electrical connection between the electrode and a drive element can be made with high reliability.

Another object of the invention is to provide a method of producing a display panel having a substrate provided with a transparent electrode, which can produce such a display panel that an electrical connection between the electrode and a drive element can be made with high reliability.

The invention provides a display panel including:

a display layer for performing display;

a flexible substrate for holding or carrying the display layer;

a transparent electrode formed on the flexible substrate; and a metal film formed on the flexible substrate, electrically connected to the transparent electrode and made of a material different from that of the transparent electrode.

Further, the invention provides a method of producing a display panel including:

an electrode forming step of forming a transparent electrode of a predetermined form on a flexible substrate;

a metal film forming step of forming a metal film of a predetermined form on the flexible substrate so that the metal film is electrically connected to the transparent electrode, the metal film being made of a material different from that of the transparent electrode; and a step of holding or carrying a display layer with the flexible substrate carrying the transparent electrode and the metal film, the display layer being provided for performing display.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1(A) is a schematic perspective view of a front side of an example of a liquid crystal display panel according to the invention, and FIG. 1(B) is a schematic perspective view showing a back side of the same liquid crystal display panel.

DESCRIPTION OF THE PREFERRED EMBODIMENTS

§ 1. Display Panel

Figure 2A:
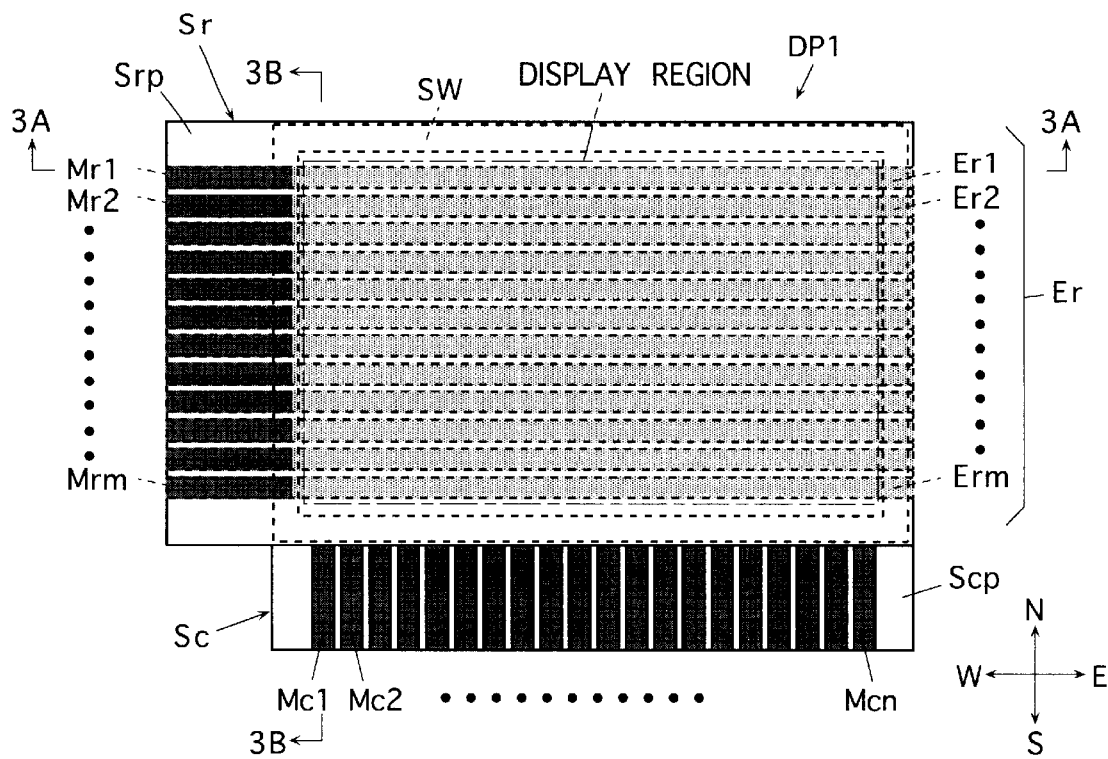
FIG. 2(A) is a schematic plan showing the front side of the liquid crystal display panel in FIG. 1(A)

In the following description, presented is a display panel which has advantages described later.

§ 1.1

The display panel has a display layer for performing display.

The display layer is a layer of which state is changed by applying a voltage thereto, by applying an electric field thereto, by supplying an electric current thereto or other method. In other words, the display layer can change its state by the voltage application or the like. For example, the display layer may be a layer of which light transmission index, light reflection index or light emission state is changed by the voltage application or the like.

The display layer may be, e.g., a light control layer for controlling of reflection or transmission of incoming light. This light control layer may be a layer (liquid crystal layer) including a liquid crystal, which is used, e.g., in a liquid crystal display element. Thus, the liquid crystal layer may be used as the display layer in the display panel so that the display panel can be used as the liquid crystal display panel.

The display layer may be a self-light emission layer, which can emit light by itself. This self-emission layer may be an organic luminous film used in an organic electroluminescence element or an inorganic luminous film used in an inorganic electroluminescence element. Thus, the display panel may employ the display layer formed of the organic luminous layer, whereby the display panel can be used as the organic electroluminescence display panel (organic EL display panel). If the display panel employs the display layer formed of the inorganic luminous layer, the display panel can be used as the inorganic electroluminescence display panel (inorganic EL display panel).

The display layer is held between a pair of substrates, or is carried (held) on one substrate. Thus, the display panel has at least one substrate for holding or carrying the display layer. If the liquid crystal layer is employed as the display layer, the liquid crystal layer (display layer) may be held between the paired substrates. If the organic or inorganic luminous film is employed as the display layer, the display layer may be held between the paired substrates, or may be carried on single substrate.

In the display panel, the substrate for holding or carrying the display layer is flexible. If the display panel has the paired substrates, at least one of the substrates may be flexible.

The flexible substrate may be a resin substrate. Material for the resin substrate may be polyether sulfone (PES), polycarbonate (PC), polyethylene terephthalate (PET), polyarylate (PA), polyether ether ketone (PEEK) or annular amorphous polyolefine. The substrate may have a thickness in a range from about 50 μm to about 1000 μm. A thin substrate (film substrate) can reduce the whole thickness of the display panel, and can further reduce the weight.

A transparent electrode is formed on the flexible substrate provided for holding or carrying the display layer. The electrode formed on the flexible substrate (first substrate) is one (first electrode) of paired electrodes (first and second electrodes), which are formed on the opposite sides of the display layer for voltage application or other purposes. If the display panel has the paired substrates (first and second substrates) for holding the display layer, the other electrode (second electrode) may be formed on the substrate (second substrate) other than the flexible substrate (first substrate). In the display panel having only one substrate (flexible substrate) for carrying the display layer, the other electrode (second electrode) may be formed on the display layer.

From another viewpoint, if the electrode can be formed on the display layer, it is not necessary to hold the display layer between the paired substrates. If the electrode cannot be formed on the display layer, the display layer typically may be held between the paired substrates, and the electrodes typically may be formed on the respective substrates. If the liquid crystal layer is employed as the display layer, the liquid crystal layer typically may be held between the paired substrates, and the electrodes typically may be formed on the respective substrates. If the organic or inorganic luminous film of the EL element is employed as the display layer, the luminous film may be carried on the one substrate, and the first electrode, the luminous film and the second electrode may be formed on this substrate in this order.

The electrodes formed on the opposite sides of the display layer may be used for simple matrix drive. In this case, a plurality of the electrodes having the following forms may be arranged on each of the sides (first and second sides) of the display layer. The plurality of the electrodes arranged on the first side may be parallel belt-like electrodes, which are arranged at a predetermined pitch in a display region. Likewise, the plurality of the electrodes arranged on the second side may be parallel belt-like electrodes, which are arranged at a predetermined pitch in the display region. The electrodes on the first side may be perpendicular to the electrodes on the second side.

The electrodes arranged on the opposite sides of the display layer may be configured to perform the active matrix drive.

In any one of the above cases, at least one electrode is formed on the flexible substrate, and at least one electrode is transparent.

The transparent electrode on the flexible substrate may be made of ITO (Indium Tin Oxide), IZO (Indium Zinc Oxide) or others.

§ 1.2.

In the display panel, not only the transparent electrode but also a metal film is formed on the flexible substrate.

If the display panel has the paired substrates, and the paired substrates are both flexible, the following metal film may be formed on at least one of the substrates. If a plurality of the transparent electrodes are formed on the flexible substrate, the following metal film may be formed with respect to at least one of these transparent electrodes.

The metal film is made of a material different from that of the transparent electrode formed on the flexible substrate, and is electrically connected to the transparent electrode formed on the flexible substrate.

This metal film is typically used for electrically connecting the transparent electrode, which is electrically connected to the metal film, to a drive element (e.g., drive IC) used for driving the display panel. The drive element is a part of the drive device, which drives the display panel to perform the display.

The drive element may be directly mounted on the flexible substrate of the display panel, so that the drive element (e.g., an output lead of the drive IC) may be electrically connected to the transparent electrode on the flexible substrate. In this case, the lead of the drive element (e.g., the output lead of the drive IC) may be directly connected to the metal film on the flexible substrate of the display panel, so that the drive element may be electrically connected to the transparent electrode via the metal film. The lead of the drive element and the metal film may be connected together with an anisotropic conductive adhesive such as ACF (Anisotropic Conductive Film) or anisotropic conductive paste.

Instead of directly mounting the drive element on the flexible substrate of the display panel, a drive substrate (e.g., substrate of a TCP type) carrying a drive element may be connected to the flexible substrate of the display panel, so that the transparent electrode on the flexible substrate of the display panel may be electrically connected to the drive element (e.g., the output lead of the drive IC) on the drive substrate. In this case, the lead of the drive element (e.g., the output lead of the drive IC) on the drive substrate may be electrically connected to the transparent electrode on the display panel substrate via the metal film on the display panel substrate, similarly to the case where the drive element is directly mounted on the substrate of the display panel. More specifically, the lead of the drive element on the drive substrate may be electrically connected to the transparent electrode on the display panel substrate via a lead electrode formed on the drive substrate and the metal film on the display panel substrate. The anisotropic conductive adhesive such as ACF may be used for the connection between the lead of the drive element and the lead electrode on the drive substrate and/or the connection between the lead electrode on the drive substrate and the metal film on the display panel substrate.

The above metal film may be arranged in a region (e.g., substrate end region) other than the display region. The metal film may be or may not be transparent.

In the display panel described above, the following advantages can be achieved since the drive element (e.g., the lead of the drive IC) can be electrically connected to the transparent electrode on the flexible substrate via the metal film formed on the flexible substrate.

The material for the transparent electrode, formed on the flexible substrate (e.g., resin substrate) may be ITO, as already described. The ITO electrode is fragile. Therefore, in the case where the drive IC is directly mounted on the substrate, breakage such as cracking is liable to occur in the ITO electrode if the lead of the drive IC is directly connected to the ITO electrode with the anisotropic conductive adhesive such as ACF while applying a heat and a pressure. In particular, if the drive IC has the lead of a bump form, breakage is more liable to occur in the ITO electrode when connecting the lead of the drive IC to the ITO electrode. Also in the case where the drive substrate carrying the drive element is connected to the substrate of the display panel, breakage is likewise liable to occur in the ITO electrode if directly connecting the lead electrode on the drive substrate to the ITO electrode on the display panel substrate, e.g., with the anisotropic conductive adhesive while applying a heat and a pressure. Further, the ITO electrode has a low resistance against bending, and is liable to break when the substrate portion carrying the ITO electrode is bent. Furthermore, an adhesion between the ITO electrode and the flexible substrate (e.g., resin substrate) is relatively low. Therefore, the ITO electrode is liable to be disengaged from the flexible substrate when a load such as a pressure is applied thereto.

In contrast to the above, the drive element (e.g., the output lead of the drive IC) can be connected to the metal film for electrically connecting the transparent electrode to the drive element in the above display panel in the case where the drive element is to be directly mounted on the display panel substrate. Likewise, in the case of connecting the drive substrate carrying the drive element to the display panel substrate, the lead electrode on the drive substrate can be connected to the metal film for electrically connecting the transparent electrode to the drive element in the above display panel. Since the metal film has a higher resistance against breakage than the ITO electrode, the display panel already described allows electrically connection of the transparent electrode to the drive element while suppressing the breakage of the transparent electrode on the flexible substrate. Compared with the connection between the ITO electrode and the drive element (e.g., the lead of the drive IC), the connection between the metal film and the drive element can usually have higher reliability. According to the above, the transparent electrode on the flexible substrate can be electrically connected to the drive element with high reliability.

The foregoing matters can be true not only in the case where the transparent electrode on the flexible substrate is made of ITO but also in the case where it is made of, e.g., IZO.

§ 1.3.

Description is given on the display panel in further detail.

(a) The transparent electrode and the metal film, which are both formed on the flexible substrate, may be electrically connected to each other in the following way.

For example, only a portion of the metal film may be overlapped with an end portion of the transparent electrode. More specifically, a portion of the metal film may be overlapped with the end portion of the transparent electrode, and the other portion of the metal film may be directly or indirectly formed on the substrate portion not carrying the transparent electrode. In other words, a portion of the metal film may be directly formed on the electrode, and the other portion of the metal film may be directly or indirectly formed on the substrate portion not carrying the transparent electrode.

According to the above structure, the metal film can have a portion not overlapping with the transparent electrode (e.g., ITO electrode). Thereby, in the case of directly mounting the drive element on the display panel substrate, the lead of the drive element can be connected to the metal film portion not overlapping with the transparent electrode. Likewise, in the case of connecting the drive substrate carrying the drive element to the display panel substrate, the lead electrode on the drive substrate can be connected to the metal film portion not overlapping with the transparent electrode on the display panel substrate. Thereby, breakage of the transparent electrode (e.g., ITO electrode) can be further suppressed.

If the metal film portion not overlapping with the transparent electrode is located on the end portion (end region) of the flexible substrate, the substrate end portion can be bent while suppressing breakage of the transparent electrode (e.g., ITO electrode). Since the metal film has a higher strength against bending than the transparent electrode made of ITO or others, the bending of the substrate portion carrying the metal film hardly causes breakage of the metal film. Since the metal film can be formed on the flexible substrate (e.g., resin substrate) to adhere or fix to the flexible substrate with higher adhesion force, disengagement of the metal film from the flexible substrate can be suppressed even when the substrate portion carrying the metal film is bent. Thus, by forming the metal film on the flexible substrate end portion and overlaying only a portion of the metal film on the transparent electrode, it is possible to bend the substrate end portion while suppressing breakage of the transparent electrode.

b) In the case where only a portion of the metal film is overlapped with the transparent electrode end portion as described above, the electrode end portion may be covered with the metal film. Since an adhesion strength between the transparent electrode (e.g., ITO electrode) and the metal film is relatively low, and the adhesion strength between the substrate and the metal film is relatively high, it is possible to prevent disengagement of the metal film from the transparent electrode by forming the metal film to cover not only the electrode end portion but also the substrate portion around the electrode end portion.

At least a portion of the transparent electrode end portion may have a smaller width than the other electrode portion, and the metal film may cover the electrode end portion having the smaller width. Thereby, even in the case where a substrate region, onto which the metal film is allowed to be formed, is restricted, it is possible to increase the adhesion area of the region where the metal film portion and the substrate portion are adhered together around the overlapping portions of the metal film and the electrode, and therefore, it is possible to prevent disengagement of the metal film from the electrode. The above structure is useful in the case where, e.g., a plurality of electrodes is arranged on the substrate, and the metal films are provided for the respective electrodes, and thereby the substrate region where the metal film can be formed is restricted.

(c) In the display panel, the display layer may be arranged between the flexible substrate, on which the transparent electrode and the metal film are formed, and a second substrate, and a sealing wall may be formed between the substrates to surround the display layer. If the display layer is formed of the liquid crystal layer, the sealing wall may be employed for preventing leakage of the liquid crystal between the substrates and/or other purposes. The sealing wall may be provided for preventing entry of external moisture and/or oxygen ($O_2$) into the display layer. The second substrate may be the substrate for holding the display layer, or may not be provided for holding the display layer but for, e.g., sealing.

In the case where only a portion of the metal film is overlapped with the transparent electrode end portion, the sealing wall arranged between the substrates may cover the portions of the electrode and the metal film overlapping with each other. According to this structure, the sealing wall pushes the overlapping portions of the electrode and the metal film, and thereby it is possible to suppress that the overlapping portions receives a load such as a bending load. Therefore, it is possible to suppress disengagement of the metal film from the electrode (e.g., ITO electrode).

(d) The metal film may have a thickness, which does not substantially impede the flexibility of the flexible substrate portion carrying this metal film. More specifically, the metal film may have a thickness, e.g., in a range from about thousands of angstroms to about 10 $\mu$m.

(e) The metal film may be made of gold (Au), copper (Cu), chromium (Cr), nickel (Ni) or aluminum (Al). If gold, copper, chromium or nickel is employed as the material for the metal film, the metal film may be formed, e.g., by plating. If aluminum is employed, the metal film may be formed by sputtering, vacuum deposition or other method.

The metal film may be composed of two or more metal layers (metal films) layered together. In this case, these metal layers may be made of the same material or different materials. The respective metal layers may be formed by the same method or different method.

(f) The flexible substrate provided with the transparent electrode and the metal film may be further provided with a function film such as an insulating film, a gas barrier film, an orientation-film or a stabilizer film having predetermined purpose.

The function film may be arranged on the transparent electrode. If such a structure is not required that the function film directly face the display layer (e.g., liquid crystal layer), the function film may be interposed between the electrode and the substrate.

(g) In the case where the plurality of the electrodes are formed on the flexible substrate, the foregoing metal films may be provided for the respective electrodes, so that the same effect can be achieved.

(h) In the display panel, the display later may be the liquid crystal layer as already described, whereby the display panel can be used as the liquid crystal display panel.

The liquid crystal display panel may be of a light transmission type or a light reflection type.

A display mode of the liquid crystal display panel is not restricted, and may be a twisted nematic (TN) mode, a super-twisted nematic (STN) mode, a cholesteric selective reflection mode, a dynamic scattering mode, a guest-host mode, an ECB mode, a phase change mode, a polymer dispersed liquid crystal mode, a ferroelectric liquid crystal mode or an anti-ferroelectric mode.

The liquid crystal (liquid crystal composition) in the liquid crystal layer may be appropriately selected to satisfy the conditions for the required display mode of the liquid crystal display element. For example, nematic liquid crystal may be used for the TN mode. For the STN mode, liquid crystal including nematic liquid crystal and a minute amount of chiral material added thereto may be used. For the cholesteric selective reflection mode, cholesteric liquid crystal, or chiral nematic liquid crystal including nematic liquid crystal and a chiral material added thereto for exhibiting the cholesteric phase, may be used. For the dynamic scattering mode, liquid crystal including nematic liquid crystal having negative dielectric anisotropy and a conductive material such as electrolyte, which is dissolved in the nematic liquid crystal for reducing a specific resistance, may be used. For the guest-host mode, liquid crystal including host liquid crystal and dichromatic pigments added thereto as the guest may be used. For the ECB mode, liquid crystal including nematic liquid crystal having negative dielectric anisotropy and a chiral material added thereto may be used. For the phase change mode, cholesteric liquid crystal having positive dielectric anisotropy, or liquid crystal including nematic liquid crystal and nematic liquid crystal having positive dielectric anisotropy mixed thereto, may be used. For the polymer dispersed liquid crystal mode, nematic liquid crystal or cholesteric liquid crystal may be used. For the ferromagnetic liquid crystal mode, ferromagnetic liquid crystal may be used. For the anti-ferromagnetic liquid crystal mode, anti-ferromagnetic liquid crystal may be used.

Among them, the cholesteric selective reflection mode can perform bright display without a polarizing plate and a back light, and further can easily perform the full-color display. In this mode, the liquid crystal in the liquid crystal layer may be, e.g., a liquid crystal composition containing liquid crystal which exhibits a cholesteric phase, e.g., at a room temperature. The liquid crystal exhibiting the cholesteric phase selectively reflects the light of a wavelength corresponding to a helical pitch of the liquid crystal. Therefore, the liquid crystal display panel including the liquid crystal exhibiting the cholesteric phase can be used as the liquid crystal display panel of the reflection type. The liquid crystal exhibiting the cholesteric phase may additionally contain dye for adjusting the displayed color.

The liquid crystal exhibiting the cholesteric phase may be the cholesteric liquid crystal which exhibits the cholesteric phase by itself, or the chiral nematic liquid crystal which contains a nematic liquid crystal and a chiral agent added thereto. The chiral nematic liquid crystal has such an advantage that the helical pitch can be adjusted in accordance with an amount of added chiral agent, and thereby the selective reflection wavelength can be easily adjusted.

(i) The display panel may be a single-layer display panel having only one display layer, or may be a multi-layer display panel having a plurality of the display layers layered together. If the liquid crystal layer is employed as the display layer, the liquid crystal display panel may be a single-layer liquid crystal display panel having only one liquid crystal layer, or may be a multi-layer liquid crystal display panel having a plurality of the liquid crystal layers layered together.

In the multi-layer display panel, any one of the display layers is held between paired substrates, or is carried (held) on one substrate. In the case where the display panel is the multi-layer display panel, the foregoing matters are true with respect to at least one of the display layers and the substrate holding or carrying it. Naturally, the foregoing matters may be true with respect to all the display layers and the substrates holding or carrying them.

§ 2. Method of Producing Display Panel

In the following description, presented is a display panel producing method, which can be utilized for producing the foregoing display panel described in the section §1.

§ 2.1.

The producing method includes an electrode forming step, a metal film forming step and a display layer carrying/holding step.

In the electrode forming step, at least one transparent electrode of a predetermined form (predetermined pattern) is formed on a flexible substrate. In the electrode forming step, a plurality of the transparent electrodes each having a predetermined form may be formed on the flexible substrate.

In the metal film forming step, at least one metal film of a predetermined form (predetermined pattern) is formed on the flexible substrate. The metal film is formed with a material different from that of the transparent electrode. The metal film is formed so as to electrically connect to the transparent electrode. In the case where the plurality of the transparent electrodes each having a predetermined form are formed in the electrode forming step, a plurality of the metal films each having a predetermined form may be formed for the respective electrodes so that the metal films are electrically connected to the respective electrodes. The metal film may be formed, e.g., by plating.

The electrode forming step may be executed before, after or simultaneously with the metal film forming step.

In the display layer holding/carrying step, the display layer is held or carried by the flexible substrate carrying at least one transparent electrode of the predetermined form and at least one metal film of the predetermined form. In the case where the display layer is to be held between the paired substrates, the display layer may be held with the flexible substrate carrying the electrode and the metal film, and the second substrate. In the case where the display layer is to be carried by single substrate, the display layer may be formed on the flexible substrate carrying the electrode and the metal film.

§ 2.2.

In the electrode forming step, the electrode of the predetermined form (e.g., belt-like electrode) may be formed by forming a solid electrode material film over a predetermined region of the substrate, and then removing a predetermined portion of the solid electrode material film by utilizing photolithography method, etching method and/or other method to pattern the solid electrode material film into the predetermined form (final form) of the electrode. The solid electrode material film may be formed by a known depositing method such as sputtering or vapor deposition.

In the metal film forming step, the metal film of the predetermined form may be formed by, similarly to the electrode forming step, forming a solid metal film over a predetermined region of the substrate, and then removing a predetermined portion of the solid metal film by utilizing photolithography method, etching method and/or other method to pattern the solid metal film into the predetermined form (final form) of the metal film. Alternatively, the metal film of the predetermined form may be formed on the substrate by forming a mask on the substrate to expose a region where the metal film of the predetermined form (final form) is to be formed, and then forming the metal film through the mask to form the metal film of the predetermined form, and removing the mask. Anyway, the metal film may be formed by a plating method such as electrolytic plating method or electroless plating method, or a depositing method such as sputtering or vapor deposition.

More specifically, the transparent electrode of the predetermined form and the metal film of the predetermined form may be formed on the substrate as described in the following section §2.2.1. or §2.2.2.

§ 2.2.1.

For example, the transparent electrode and the metal film of the predetermined forms (final forms) may be formed in the following steps (A1)–(A4):

(A1) forming the transparent electrode of the predetermined form on the substrate;

(A2) forming a mask on the substrate carrying the transparent electrode so that a region, onto which the metal film is to be formed, of the substrate is exposed without hidden by the mask;

(A3) forming the metal film on the substrate through the mask to form the metal film of the predetermined form; and (A4) removing the mask.

§ 2.2.2.

Instead of the above, the transparent electrode and the metal film of the predetermined forms (final forms) may be formed in the following steps (B1)–(B5):

(B1) forming a solid electrode material film made of a material of the transparent electrode over a first region of the flexible substrate, the first region including a region onto which the transparent electrode of the predetermined form is to be formed;

(B2) forming a solid first metal film over a second region of the flexible substrate carrying the solid electrode material film, the second region including a region onto which the metal film of the predetermined form is to be formed;

(B3) forming a mask on the flexible substrate carrying the solid electrode material film and the solid first metal film so that a region of the flexible substrate except for a third region is exposed without hidden by the mask, the third region including the region onto which the transparent electrode of the predetermined form is to be formed and the region onto which the metal film of the predetermined form is to be formed;

(B4) removing a portion, not covered with the mask, of the solid electrode material film and a portion, not covered with the mask, of the solid first metal film to form the transparent electrode of the predetermined form and the first metal film of the predetermined form on the flexible substrate; and (B5) removing the mask.

In the above step (B2) of forming the solid first metal film, the solid first metal film may be formed so as to overlap partially or entirely with the solid electrode material film. The solid first metal film may be formed, e.g., by sputtering.

In the above step (B4), the removal of the electrode material film portion and the solid first metal film portion not covered with the mask may be performed by etching. In this case, the mask formed in the above step (B3) may be made of a resist material having resistant against the etching.

In the case where the electrode and the metal film of the predetermined forms are formed in the above steps, a second metal film, typically having the same form as the first metal film, may be further formed on the first metal film of the predetermined form after removing the mask.

By forming the second metal film on the first metal film, the whole film thickness of the metal films, which is equal to a sum of the thicknesses of the first and second metal films, can be large even if the first metal film is thin. If the whole thickness of the single-layer or multi-layer metal film (e.g., first metal film) is excessively small, a line or interconnection formed of the metal film may be broken by a small crack, which may occur on the surface of the flexible substrate due to the bending of the flexible substrate. In contrast, if the whole thickness of the metal films is large, breakage of the line or interconnection due to the small crack, which may occur on the flexible substrate surface, can be suppressed owing to the thickness of the metal films and the flexibility.

The second metal film may be formed by electrolytic plating. For forming the second metal film on the first metal film by electrolytic plating, the first metal film may be used as one of paired electrodes for the electrolytic plating. By performing the electrolytic plating for forming the second metal film, the second metal film is not formed on a substrate portion having a low conductivity. If the electrode is made of ITO, the second metal film is not formed on the ITO electrode by the electrolytic plating. If the substrate is formed of the resin substrate, the second metal film is not formed by the electrolytic plating on the substrate portion not bearing the electrode and also not bearing the first metal film. Accordingly, by forming the second metal film by the electrolytic plating, the second metal film can be formed only on the first metal film of the predetermined form, and thereby the second metal film has the same form as the first metal film.

In the case where a plurality of the transparent electrodes each having the predetermined form as well as a plurality of the metal films each having the predetermined form and electrically connected to the respective electrodes are formed on the flexible substrate, and further each of the metal films has the multi-layer structure formed of the first and second metal films, and furthermore each of the second metal films are formed by electrolytic plating, the electrodes and the multi-layer metal films may be formed in the following way.

In the foregoing step (B1) of forming the solid electrode material film, the solid electrode material film may be formed over a predetermined substrate region including the region where the plurality of the electrodes of the predetermined forms are to be formed. Since the substrate will be partially removed in a later step, the size of the substrate, on which the solid electrode material film is formed, may be larger than the final size of the substrate.

In the foregoing step (B2) of forming the solid first metal film, the solid first metal film may be formed over a predetermined substrate region including a region on which the plurality of the metal films of the predetermined forms as well as a connection metal film for electrically connecting these metal films are to be formed.

In the foregoing step (B3) of forming the mask, the mask may be formed to expose the region other than a predetermined region including a region on which the plurality of the electrodes of the predetermined forms are to be formed, a region on which the plurality of the metal films of the predetermined forms are to be formed, and a region on which the connection metal film for electrically connecting these metal films is to be formed.

In the foregoing step (B4), as already described, the electrode material film portion not covered with the mask and the solid first metal film portion not covered with the mask is removed. Thereby, the plurality of the electrodes of the predetermined forms, the plurality of first metal films of the predetermined forms and the first metal film (first connection metal film) for electrically connecting these first metal films are formed on the substrate.

In the foregoing step (B5), as already described, the mask is removed.

Thereafter, the second metal films may be formed by the electrolytic plating on the respective plurality of the first metal films of the predetermined forms and the first connection metal film for electrically connecting these first metal films. Since the first connection metal film is present on the substrate when performing the electrolytic plating, it is not necessary to connect each of the plurality of the first metal films of the predetermined forms to a power source, and therefore the second metal films can be formed on the respective plurality of the first metal films of the predetermined forms only by connecting, e.g., the first connection metal film to the power source. This allows easy formation of the second metal films on the respective first metal films of the predetermined forms.

After forming the second metal films, the substrate portion carrying the first connection metal film is removed or cut off to provide the substrate on which the plurality of the electrodes of the predetermined forms and the plurality of the multi-layer metal films (formed of the firsthand second metal films layered together) of the predetermined forms are formed.

§ 2.3.

In the producing method, the liquid crystal layer may be used as the display layer to form the liquid crystal display panel, in which case the display panel may be produced as follows.

First, the paired substrates (first and second substrates) for holding the display layer therebetween are prepared. At least the first substrate between the first and second substrates is flexible. In other words, at least one of the paired substrates (first and second substrates) is flexible. The second substrate may be or may not be flexible.

Then, at least one transparent electrode of the predetermined form and at least one metal film of the predetermined form are formed on the first substrate. At least one electrode of the predetermined form is formed on the second substrate. The metal film may be formed on the second substrate.

Then, the liquid crystal layer is held between the first substrate carrying the electrode and the metal film, and the second substrate carrying the electrode. For example, the liquid crystal is supplied onto at least one of the first and second substrates, and then the first and second substrates are joined together with the liquid crystal therebetween so that the liquid crystal layer is held between the substrates. Alternatively, the first and second substrates may be joined together with a predetermined space therebetween, and then the liquid crystal is filled into the space so that the liquid crystal layer is held between the substrates.

Before joining the substrates together, a sealing wall may be formed on one of the substrates for preventing leakage of the liquid crystal between the substrates.

A spacer may be arranged on at least one the substrates before joining the substrates, whereby the predetermined space can be kept between the first an second substrates joined together.

§ 3.

Referring to the drawings, embodiments of the display panel and the producing method will be described.

In the following description, specific names of substances (e.g., substrate substances and electrode materials) as well as specific physical properties (e.g., selective reflection wavelength) are mentioned mere by way of example, and the invention is not restricted to them.

FIGS. 1(A) and 1(B) are schematic perspective views of an example of a liquid crystal display panel, i.e., display panel DP1. FIG. 1(A) shows a front side, on which contents are displayed for observation, of the display panel DP1, and FIG. 1(B) shows a back side of the display panel DP1 opposite to the observation side (front side).

Figure 2B:
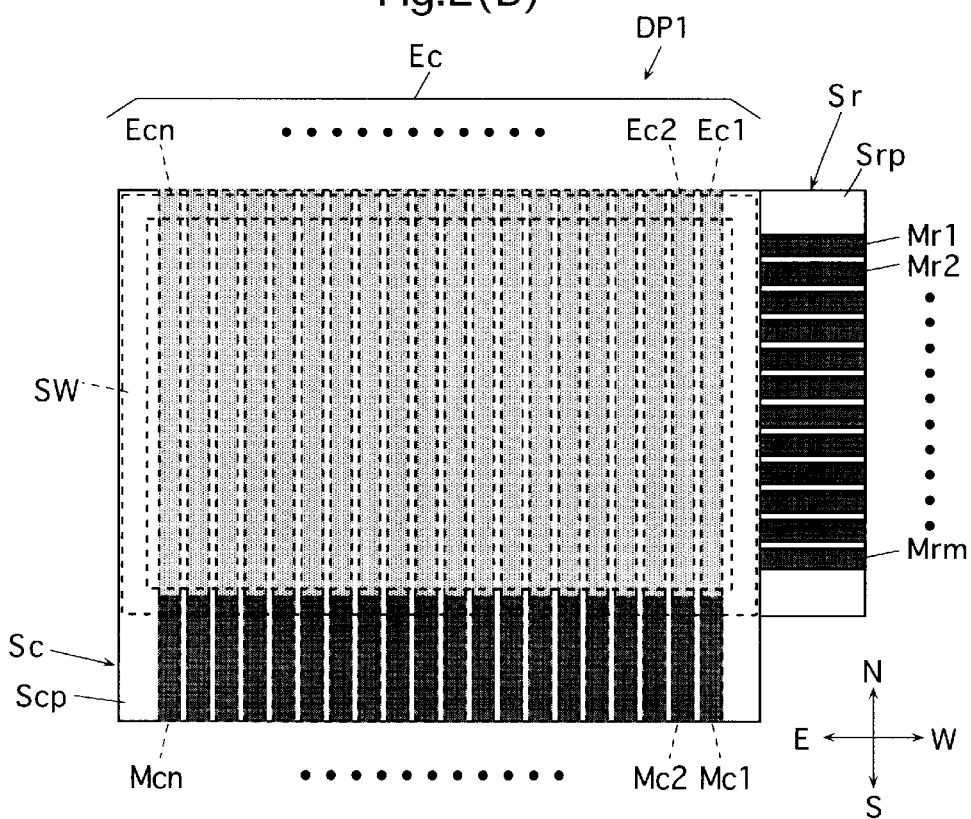
FIG. 2(B) is a schematic plan showing the back side of the same liquid crystal display panel.

FIGS. 2(A) and 2(B) are plans showing the front and back sides of the display panel DP1, respectively. Upper, lower, left and right sides, in FIG. 2(A), of the display panel DP1 may be referred to as "north (N)", "south (S)", "west (W)" and "east (E)" sides, respectively.

Figure 3A:
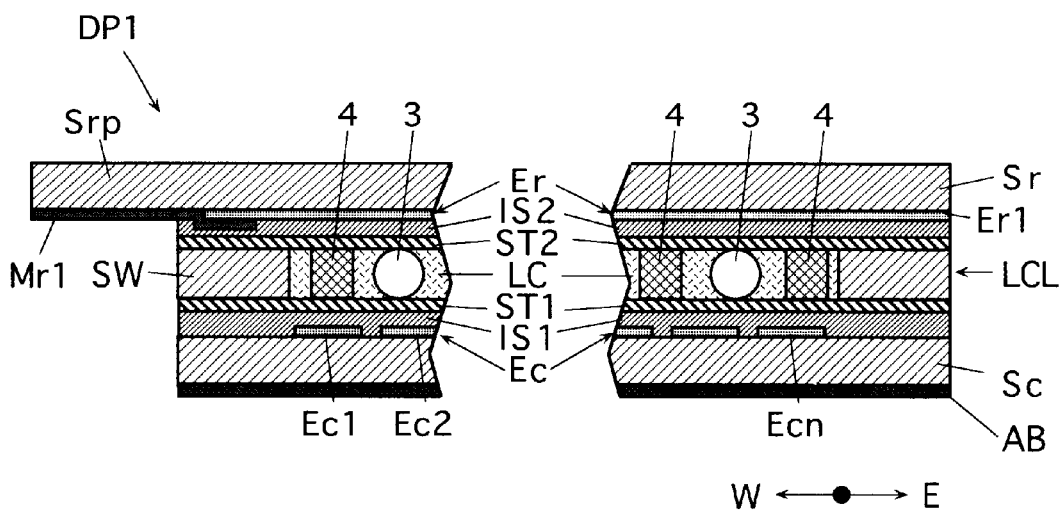
FIG. 3(A) is a schematic cross section of the liquid crystal display panel of FIG. 1(A) taken along line 3A—3A in FIG. 2(A)
Figure 3B:
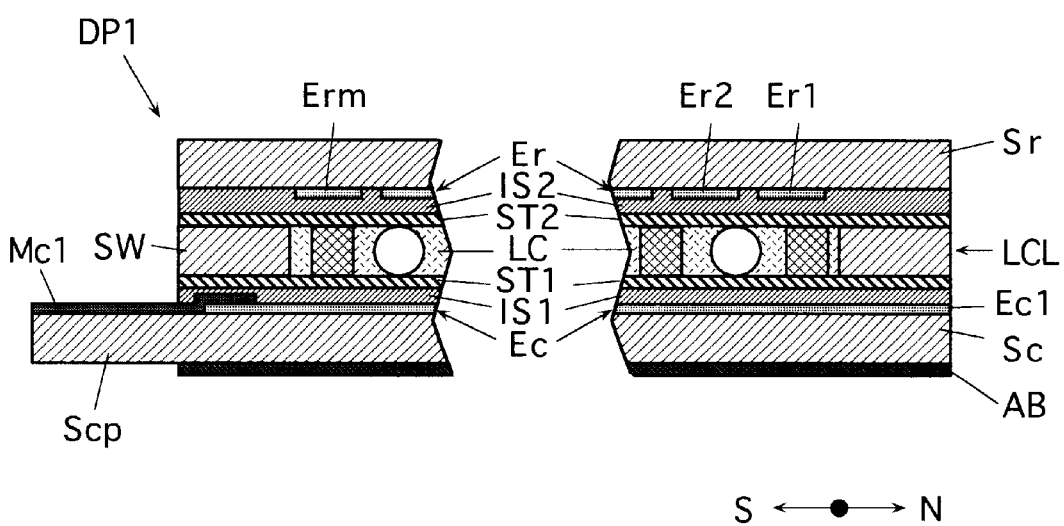
FIG. 3(B) is a schematic cross section of the same liquid crystal display panel taken along line 3B—3B in FIG. 2(A).

FIGS. 3(A) and 3(B) are schematic cross sections of the liquid crystal display panel DP1 taken along lines 3A—3A and 3B—3B in FIG. 2(A), respectively.

The liquid crystal display panel DP1 is of the reflection type. Contents displayed on display panel DP1 are viewed or observed from the upper side of the display panel DP1 in FIG. 3(A).

The display panel DP1 has a pair of substrates Sr and Sc as well as a liquid crystal layer LCL held between these substrates.

A black light absorber film AB (see FIGS. 3(A) and 3(B)) is arranged on the back side of the substrate Sc, which is arranged on the side remote from the observation side. In the figures other than FIGS. 3(A) and 3(B), the light absorber film AB is not shown for easy understanding. The light absorber film AB is formed by applying a black paint over the substrate Sc.

The liquid crystal layer LCL in this embodiment is a layer of a liquid crystal LC, which has a selective, reflection wavelength in a green range (see FIGS. 3(A) and 3(B)). The liquid crystal LC in this embodiment is a chiral nematic liquid crystal exhibiting the cholesteric phase at a room temperature.

A sealing wall SW is arranged around the liquid crystal LC between the substrates Sc and Sr, as shown in FIGS. 2(A), 3(A) and others. The sealing wall SW has an annular or frame-like form, and is located between the substrates Sc and Sr. The sealing wall SW is adhered to each of the substrates Sc and Sr. The liquid crystal LC is arranged in a space defined by the substrates Sc and Sr and the sealing wall SW. The sealing wall SW prevents the leakage of the liquid crystal LC between the substrates.

The substrates Sr and Sc in this example are formed of resin films, and are flexible. The substrates Sr and Sc in this embodiment are made of polycarbonate (PC).

The substrates Sr and Sc have different sizes, respectively, but both are rectangular. As shown in FIG. 2(A) and others, these substrates are overlaid on each other with a space therebetween, and exhibit an L-shaped form as a whole. The substrates Sr and Sc have portions overlaid on each other with the predetermined space therebetween. The annular sealing wall SW is arranged on the overlaid portions of the substrates, and the liquid crystal LC is arranged in the space surrounded by the substrates and the sealing wall.

As shown in FIG. 2(A), a major portion of the region surrounded by the sealing wall SW is used as a display region.

A substrate portion Srp of the substrate Sr, which is not overlaid on the substrate Sc, is used for connecting a drive substrate carrying a drive IC, as will be described later in greater detail. By connecting this drive substrate, electrodes on the substrate Sr is connected to the drive IC on the drive substrate.

Likewise, a substrate portion Scp of the substrate Sc not overlaid on the substrate Sr is used for connection to a drive substrate carrying a drive IC, and electrodes on the substrate Sc is connected to the drive IC by connecting this drive substrate.

A column electrode Ec, an insulating film IS1 and a stabilizing film ST1 are formed in this order on the substrate Sc (see FIGS. 3(A) and 3(B)). Likewise, a row electrode Er, an insulating film IS2 and a stabilizing film ST2 are formed in this order on the substrate Sr.

The insulating films IS1 and IS2 are arranged for providing electrical insulation between the column electrode Ec and row electrode Er. In this example, both the substrates Sc and Sr are provided with the insulating films. However, only one of the substrates may be provided with the insulating film.

The stabilizing films ST1 and ST2 are in contact with the liquid crystal LC. The stabilizing films ST1 and ST2 are employed for stably holding the state of arrangement of the liquid crystal molecules for a long time when the chiral nematic liquid crystal LC is set to an intended molecular arrangement state (e.g., focal conic state or planar state), e.g., by applying a voltage across the electrodes Ec and Er. Each of the stabilizing films ST1 and ST2 in this embodiment is made of a material which is known as a material of an orientation film, and is made of polyimide in this embodiment.

The column electrode Ec and the row electrode Er are employed for performing simple matrix drive of the display panel DP1. The column and row electrodes Ec and Er in this example are both made of ITO, and are transparent.

Figure 4A:
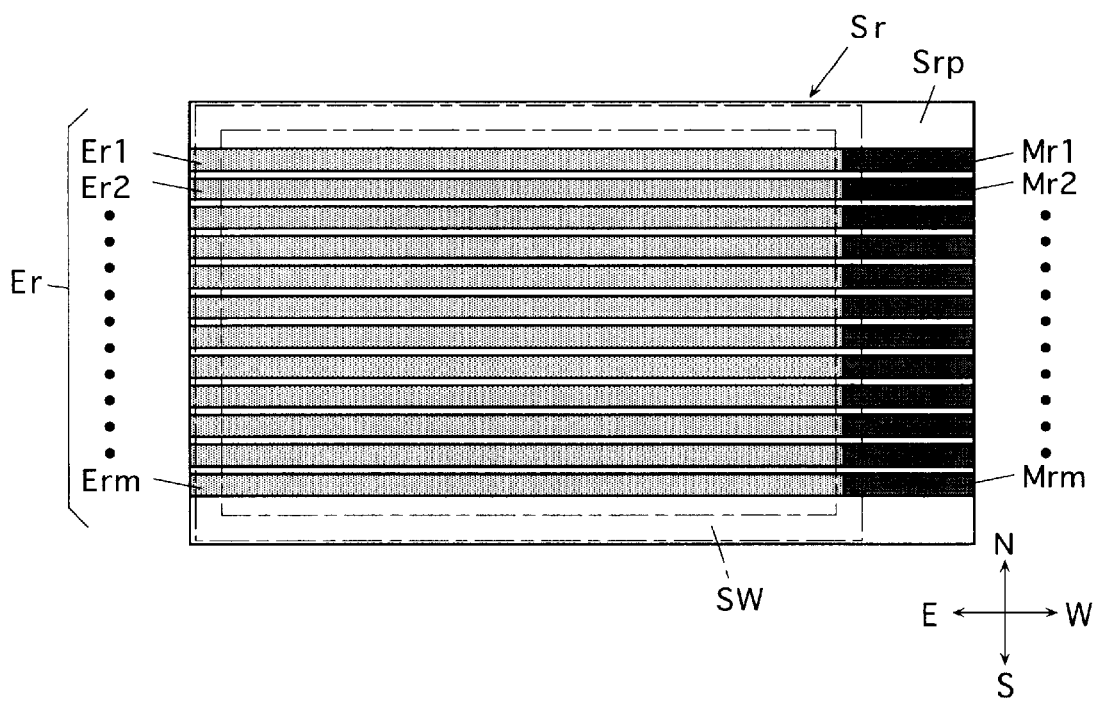
FIG. 4(A) is a schematic plan showing one of paired substrates of the liquid crystal display panel in FIG. 1(A)
Figure 4B:
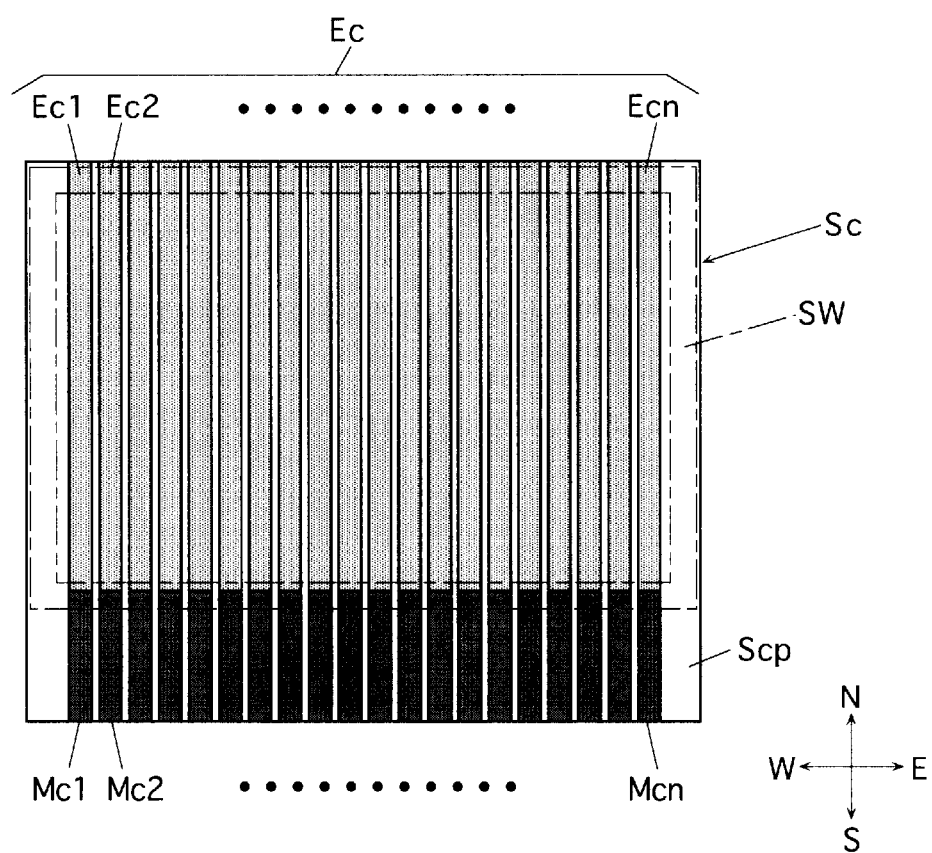
FIG. 4(B) is a schematic plan showing the other substrate.

The column electrode Ec is composed of a plurality of belt-like electrodes Ec1–Ecn, where n is an integer larger than 1, as shown in FIG. 4(B) and others. These belt-like electrodes Ec1–Ecn are parallel to each other, and are arranged at a predetermined pitch. Likewise, the row electrode Er is composed of a plurality of belt-like electrodes Er1–Erm, where m is an integer larger than 1, as shown in FIG. 4(A) and others. These belt-like electrodes Er1–Erm are parallel to each other, and are arranged at a predetermined pitch. The belt-like electrodes of the column electrode Ec are perpendicular to those of the row electrode Er, and therefore the belt-like electrodes of the column and row electrodes Ec and Er form a so-called matrix structure. The number of the belt-like electrodes forming the row electrode Er as well as the number of the belt-like electrodes forming the column electrode Ec illustrated in the figures are smaller than the actual numbers for simplicity reason.

The belt-like electrodes Ec1–Ecn forming the column electrode Ec extend from the north end of the substrate Sc to a middle position between inner and outer ends of the sealing wall SW (see FIG. 3(B) and others). As described above, the belt-like electrodes Ec1–Ecn are parallel to each other, and are arranged in the display region at the predetermined pitch. Likewise, the belt-like electrodes Er1–Erm forming the row electrode Er extend from the east end of the substrate Sr to a middle position between inner and outer ends of the sealing wall SW (see FIG. 3(A) and others). As described above, the belt-like electrodes Er1–Erm are parallel to each other, and are arranged in the display region at the predetermined pitch.

In the display panel DP1, metal films Mc1–Mcn are provided for the belt-like electrodes Ec1–Ecn forming the column electrode Ec, respectively. Also, metal films Mr1–Mrm are provided for the belt-like electrodes Er1–Erm forming the row electrode Er, respectively.

The metal films Mc1–Mcn provided for the column electrode Ec are formed on the region of the substrate Sc outside the display region, and particularly on the south end region of the substrate Sc. The metal films Mr1–Mrn provided for the row electrode Er are formed on the region of the substrate Sr outside the display region, and particularly on the west end region of the substrate Sr.

The metal film Mc1 provided for the belt-like electrode Ec1 of the column electrode Ec partially overlaps with the belt-like electrode Ec1 so that they are electrically connected to each other. The metal film Mc1 overlaps with the belt-like electrode Ec1 at the region between the inner and outer ends of the sealing wall SW, so that the sealing wall SW covers the portions of the Metal film Mc1 and the belt-like electrode Ec1 overlapping with each other. The portion of the metal film Mc1 not overlapping with the belt-like electrode Ec1 is formed directly on the substrate Sc. The metal film Mc1 extends from the position, where it overlaps with the belt-like electrode Ec1, to the south end of the substrate Sc. The metal films Mc2–Mcn are arranged on the substrate Sc in a fashion similar to the metal film Mc1.

The metal film Mr1 provided for the belt-like electrode Er1 of the row electrode Er partially overlaps with the belt-like electrode Er1 so that they are electrically connected to each other. The metal film Mr1 overlaps with the belt-like electrode Er1 at the region between the inner and outer ends of the sealing wall SW, so that the sealing wall SW covers the portions of the metal film Mr1 and the belt-like electrode Er1 overlapping with each other. The portion of the metal film Mr1 not overlapping with the belt-like electrode Er1 is formed directly on the substrate Sr. The metal film Mr1 extends from the position, where it overlaps with the belt-like electrode Er1, to the west end of the substrate Sc. The metal films Mr2–Mrm are arranged on the substrate Sr in a fashion similar to the metal film Mr1.

In this embodiment, each of the metal films Mc1–Mcn and Mr1–Mrm is made of copper (Cu). These metal films are formed by plating, as will be described later in greater detail in connection with a method of producing the display panel DP1.

A plurality of spacers 3 and a plurality of resin structures 4 are arranged between the substrates Sr and Sc carrying the electrodes, metal films and others (see FIGS. 3(A) and 3(B)). The spacers 3 and the resin structures 4 are arranged in the same layer as the liquid crystal layer LCL.

The spacers 3 are provided between the substrates Sc and Sr for controlling a gap between the substrates Sr and Sc, and in other words, for controlling a thickness of the liquid crystal layer LCL (thickness of the liquid crystal LC).

The resin structure 4 is fixed to both the stabilizing film ST1 on the substrate Sc and the stabilizing film ST2 on the substrate Sr so that the substrates Sc and Sr are joined together. The resin structures 4 increase the uniformity in gap between the substrates Sc and Sr, and also increase the whole strength of the display panel DP1.

§ 4.

When the simple matrix drive is performed in the display panel DP1, the belt-like electrodes of the column electrode Ec are used as signal electrodes (data electrodes), and the belt-like electrodes of the row electrode Er are used as scanning electrodes in this embodiment.

Figure 5:
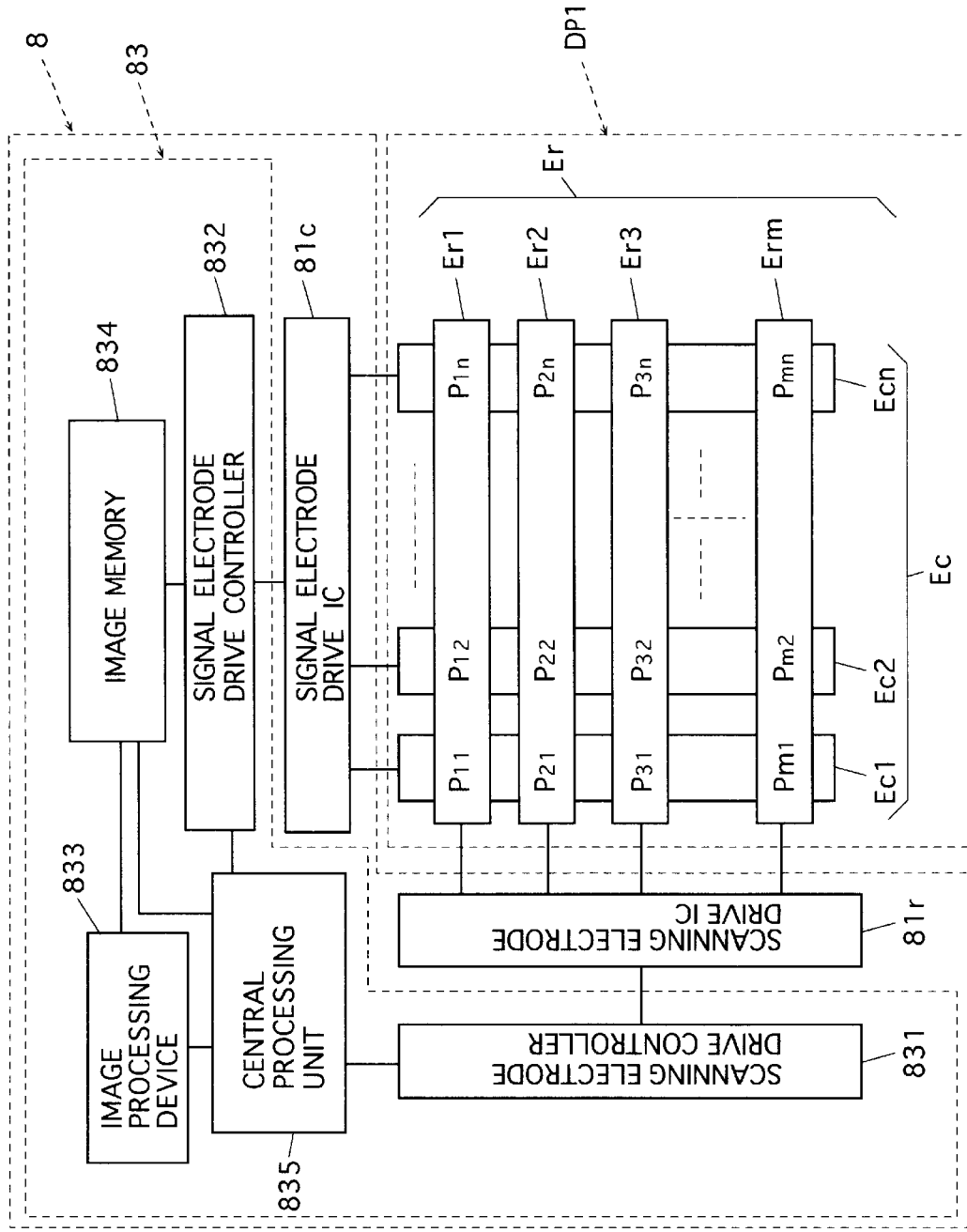
FIG. 5 is a schematic block diagram of an example of a drive device for driving the liquid crystal display panel in FIG. 1(A).

FIG. 5 is a schematic block diagram showing an example of a drive device, i.e., drive device 8, which can perform the simple matrix drive of the display panel DP1 for display.

The drive device 8 has a scanning electrode drive IC 81*r* for driving the row electrode (scanning electrode) Er and a signal electrode drive IC 81*c* for driving the column electrode (signal electrode) Ec.

These drive ICs are controlled by a controller 83 having a central processing unit 835 and others. The controller 83 applies a voltage via the drive ICs across the column and row electrodes Ec and Er (more specifically, across the belt-like elect rode of the column electrode Ec and the belt-like electrode of the row electrode Er) for performing the image display.

In the display panel DP1, the orientation of the liquid crystal can be changed by the following region unit. This region unit includes a cross region where one scan electrode and one signal electrode cross each other, and a peripheral region of the cross region. In the display panel, each pixel is formed of the cross region where one scan electrode and one signal electrode cross each other, and its peripheral region. A pixel located at the position where the scanning and signal electrodes Erp and Ecq cross each other, is referred to as pixel Ppq, where p is a natural number satisfying a relationship of ($1 \leq p \leq m$), and q is a natural number satisfying a relation ship of ($1 \leq q \leq n$).

The display panel DP1 can display images based on image data, which has been written in an image memory 834 by an image processing device 833 and the central processing unit 835, in the following manner.

The scanning electrode drive IC 81r outputs a select signal to one of the scanning electrodes Er–Erm for setting it to the selected state, and also outputs non-select signals to the other scanning electrodes for setting them to the unselected state. The scanning electrode drive IC 81r switches the scanning electrode to be set to the selected state at predetermined time intervals so that the respective scanning electrodes are successively set to the selected state. This control is performed by a scanning electrode drive controller 831.

For rewriting the respective pixels on the selected scanning electrode, the signal electrode drive IC 81c simultaneously outputs signal voltages, corresponding to the image data of the respective pixels, to the respective signal electrodes, and thereby simultaneously changes the orientations of the liquid crystal of the respective pixels to be driven (i.e., drive target pixels) in accordance with the image data. For example, when the scanning electrode Er1 is selected, the orientation of the liquid crystal in the pixels P11–P1n on the selected scanning electrode Er1 are changed in accordance with the image data of the respective pixels. A voltage difference between the voltage applied to the scanning electrode of the drive target pixel and the voltage, which is applied to the signal electrode and corresponds to the image data, is applied to the liquid crystal in the drive target pixel so that the orientation of the liquid crystal in the drive target pixel changes in accordance with the image data.

The signal electrode drive IC 82c changes the orientations of the liquid crystal in the drive target pixels in accordance with the image data every time the selected scanning electrode is changed. This control is performed by a signal electrode drive controller 832 while reading the image data from the image memory 834.

The chiral nematic liquid crystal LC in the drive target pixel is supplied with the voltage corresponding to the image data (tone data) of the drive target pixel. Therefore, the liquid crystal in the drive target pixel can be set to, in accordance with the image data of the drive target pixel, the planar state, the focal conic state or a state formed by mixing these state at a rate corresponding to the tone level. Accordingly, gradation display can be performed in accordance with the image data.

§ 5.

For driving the display panel DP1, as shown in FIG. 5, output leads of the scanning electrode drive IC 81r are electrically connected to the row electrode Er, and input leads of the drive IC 81r are connected to the controller 83.

Likewise, output leads of the signal electrode drive IC 81c are electrically connected to the column electrode Ec, and input leads of the drive IC 81c are connected to the controller 83.

Figure 6:
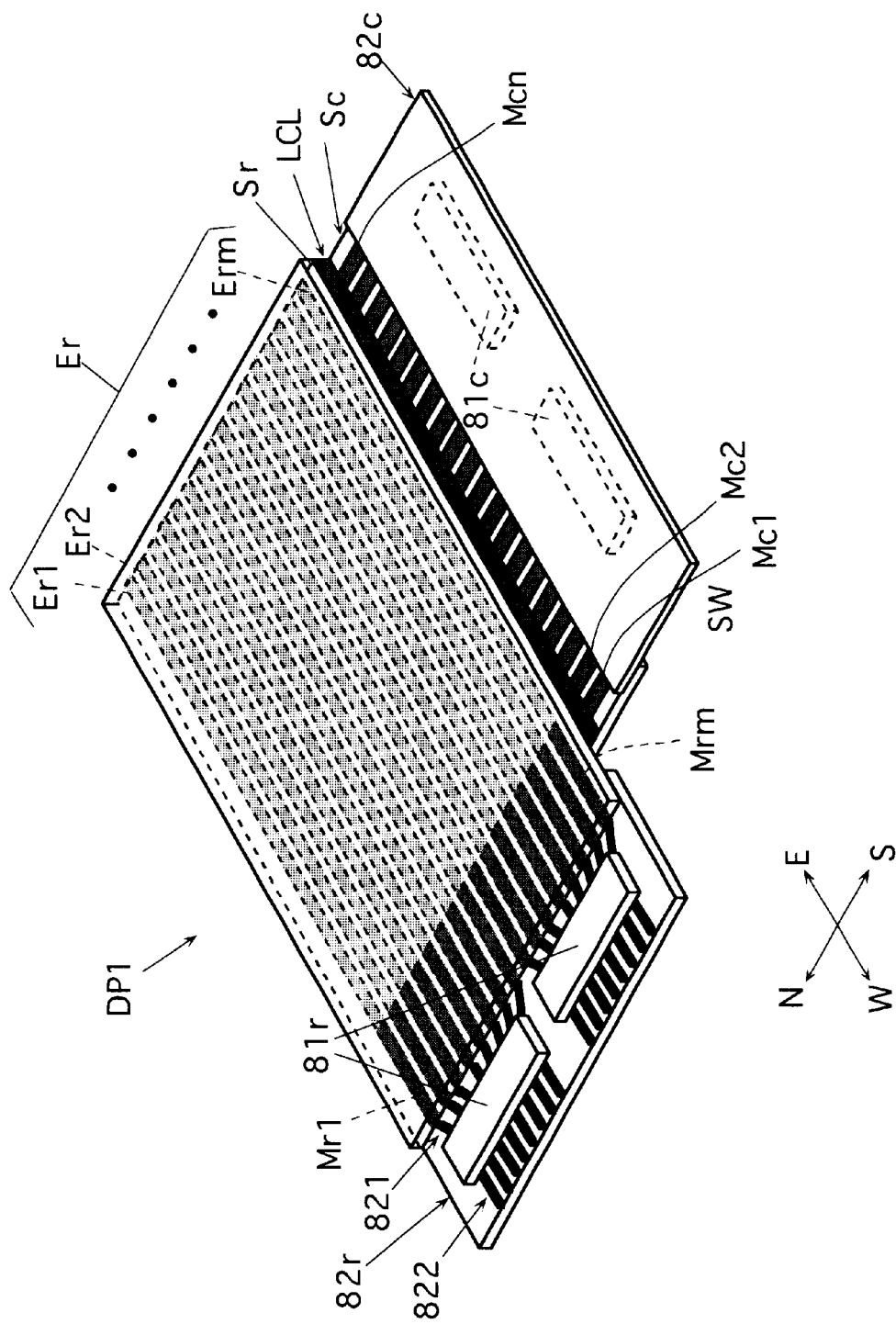
FIG. 6 is a schematic perspective view showing the liquid crystal display panel shown in FIG. 1(A) when; drive substrates each carrying drive ICs are connected to the respective substrates of the display panel.

In this embodiment, a drive substrate 82r, which carries in this example two drive ICs as the scanning electrode drive ICs 81r, is connected to the substrate Sr as shown in FIG. 6, so that the output leads of the drive ICs 81r are electrically connected to the belt-like electrodes of the row electrode Er via the metal films in the following manner. The drive substrate 82r is provided with output lead electrodes 821, which are connected to the output leads of the drive ICs 81r, respectively. The output lead electrodes 821 are connected to the metal films Mr1–Mrm, respectively, so that the output leads of the drive ICs 81r are electrically connected to the electrodes Er1–Erm via the corresponding output lead electrodes 821 and the metal films, respectively.

The drive substrate 82r, which carries the drive ICs 81r and is provided with the output lead electrodes 821, is connected to the substrate portion Srp of the substrate Sr not overlapping with the substrate Sc. More specifically, each output lead electrode 821 of the drive substrate 82r is connected to the metal film portion not overlapping with the belt-like electrode. In this embodiment, ACF (not shown in the figure) is used for connection between the output lead electrodes 821 on the drive substrate 82r and the metal films. The drive substrate 82r carrying the drive ICs 81r in this embodiment have the form of a so-called TCP (Tape Carrier Package).

By connecting a junction substrate (not shown) to the drive substrate 82r, the input leads of the drive ICs 81r are connected to the controller 83 via input lead electrodes 822 on the drive substrate 82r.

Similarly, by connecting a drive substrate 82c, which carries in this example two drive ICs as the signal electrode drive IC 81c, to the substrate Sc, the belt-like electrodes Ec1–Ecn forming the column electrode Ec are electrically connected to the corresponding output leads of the drive ICs 81c via the metal films Mc1–Mcn. Input leads of the drive ICs 81c are connected to the controller 83 via a junction substrate (not shown).

§ 6.

In the liquid crystal display panel DP1 the metal films are provided for the respective belt-like electrodes on the substrates Sr and Sc as described above, so that the following advantages can be achieved.

As already described, each of the belt-like electrodes forming the column electrode Ec and row electrode Er is made of ITO. Since ITO is fragile, breakage such as cracking is liable to occur in the ITO belt-like electrode, for example, if the output lead electrode on the drive substrate carrying the drive ICs are directly connected to the belt-like electrodes with ACF (Anisotropic Conductive Film) while applying heat and pressure. The adherence or adhesion force of the ITO belt-like electrode to the resin substrate Sr or Sc is relatively small. Accordingly, in the operation of directly connecting the output lead electrode of the drive substrate to the ITO belt-like electrode, the ITO belt-like electrode is liable to be peeled off from the substrate due to the bending load or the like.

In contrast to the above, since the display panel DP1 is provided with the metal film which is electrically connected to the ITO belt-like electrode, the output lead electrode of the drive substrate is not required to connect directly to the ITO belt-like electrode for electrically connecting the output lead electrode of the drive substrate to the ITO belt-like electrode, and can be connected to the metal film for this purpose. Since the metal film is more resistant to the load than the ITO electrode, the metal film is hard to break even if the output lead electrode of the drive substrate is directly connected to the metal film with ACF while applying pressure and heat. Since the output lead electrode of the drive substrate is connected to the metal film portion not overlapping with the ITO belt-like electrode, the ITO belt-like electrode does not break either. In the display panel DP1, therefore, the drive ICs 81r and 81c can be electrically connected to the electrodes Er and Ec, respectively, while suppressing breakage of the ITO electrodes Er and Ec.

The adherence of the metal films to the resin substrates Sr and Sc is higher than the adherence of the ITO electrodes Er and Ec to the resin substrates. Therefore, the peeling of the metal film from the substrate can be suppressed even if a bending load or the like is applied to the substrate portion carrying the metal film during connection of the output lead electrodes on the drive substrate to the metal films.

When connecting the drive substrate to the display panel substrate Sr or Sc, the display panel substrate portion carrying the ITO belt-like electrode is less subjected to the bending load or the like. Therefore, peeling of the ITO belt-like electrodes from the substrate can be suppressed, and thereby the drive substrates can be connected to the substrates Sr and Sc while suppressing the peeling of the metal films and the ITO belt-like electrodes from the substrates. This allows electrical connection between the drive ICs and the belt-like electrodes with higher reliability.

A major portion of the metal film is directly formed on the substrate portion not carrying the ITO electrodes, and the metal film portion, which is directly formed on the substrate, is arranged on the substrate end portion. Therefore, the substrate end portion, on which the metal film is directly formed, can be bent while suppressing damage to the ITO electrodes and the peeling of the ITO electrodes from the substrate.

§ 7.

In the display panel, the drive IC may be directly mounted on the display panel substrate carrying the column or row electrode for electrically connecting the drive IC to the column or row electrode, instead of connecting the drive substrate carrying the drive IC to the display panel substrate.

Figure 7A:
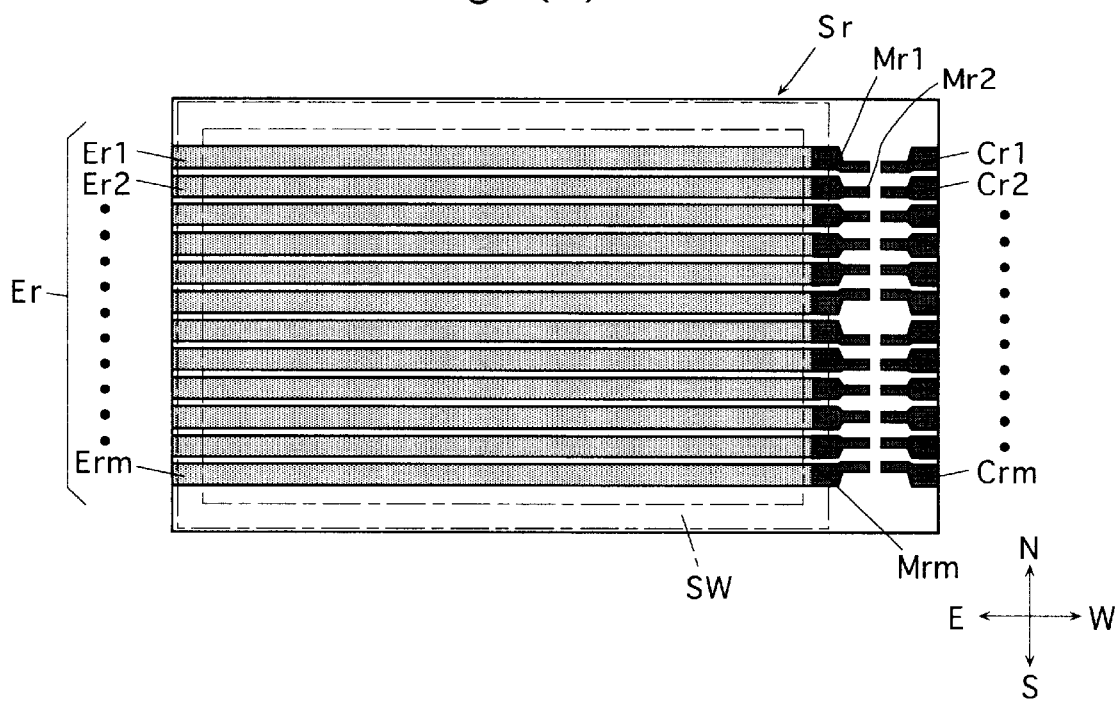
FIG. 7(A) is a schematic plan of one of paired substrates employed in another example of the liquid crystal display panel according to the invention.
Figure 7B:
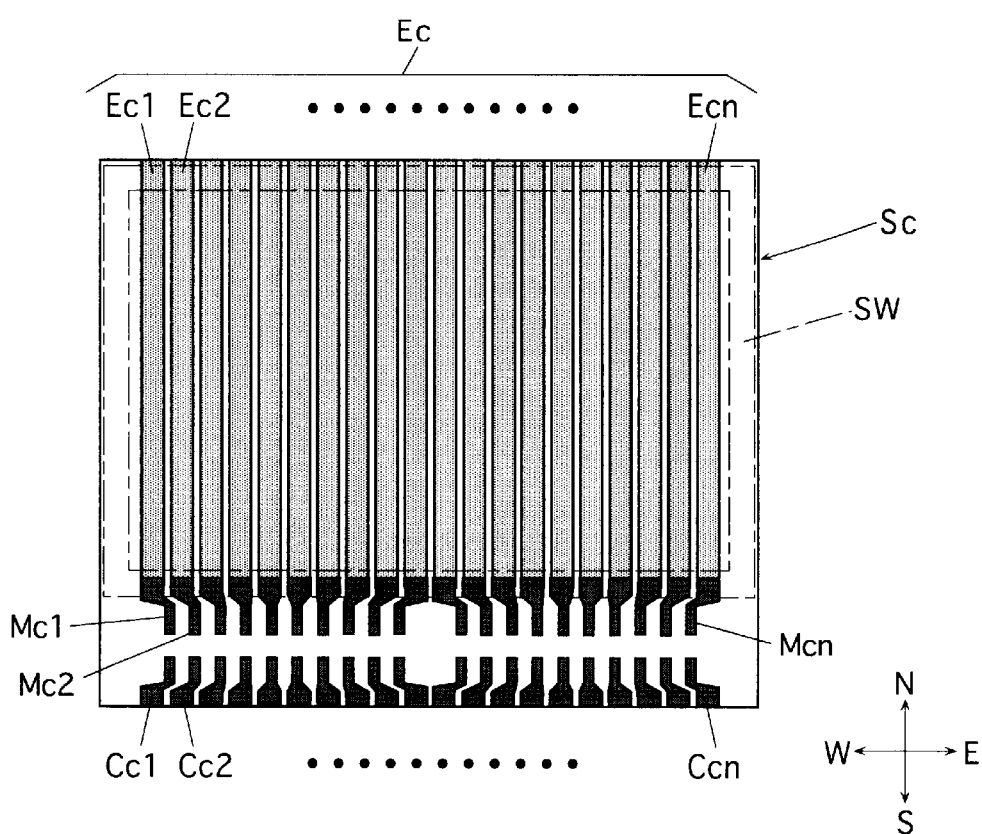
FIG. 7(B) is a schematic plan of the other substrate.
Figure 8:
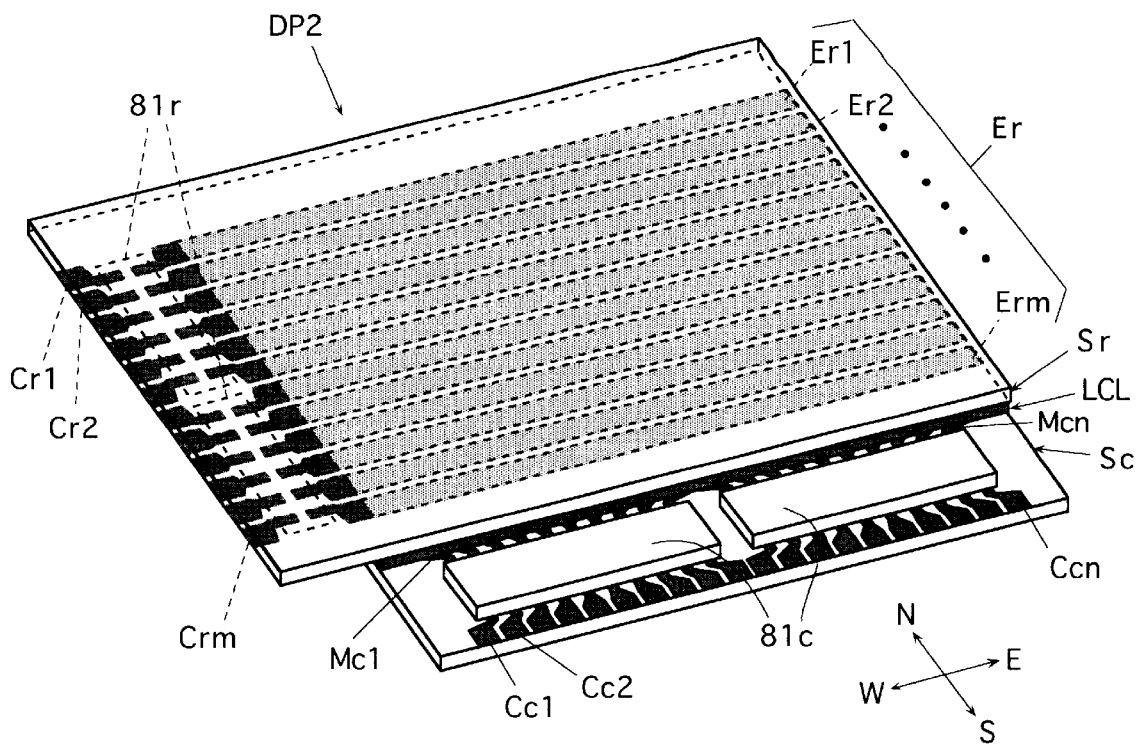
FIG. 8 is a schematic perspective view of the liquid crystal display panel having the substrates shown in FIGS. 7(A) and 7(B).

For directly mounting the drive IC on the substrate Sr or Sc of the display panel, the electrodes and the metal films may be formed on the substrate as shown in FIGS. 7(A) and 7(B), and the drive ICs 81r and 81c may be mounted on the substrates Sr and Sc, respectively, as shown in FIG. 8. Junction substrates (not shown) may be connected to the respective substrates Sr and Sc for connecting the drive ICs on the display panel substrate to the controller 83.

On the substrate Sr shown in FIG. 7(A), the belt-like electrodes Er1–Erm and the metal films Mr1–Mrm, which are electrically connected to the respective electrodes Er1–Erm, are formed similarly to those on the substrate Sr shown in FIG. 4(A). These metal films Mr1–Mrm are to be connected to the output leads of the drive IC 81r. On the substrate Sr shown in FIG. 7(A), conductive films Cr1–Crm, which are to be connected to the input leads of the drive IC 81r, are also formed. The conductive films Cr1–Crm in this embodiment are made of the same metal material as the metal films Mr1–Mrm. The metal films Mr1–Mrm have forms (patterns), which allow connection of the belt-like electrodes Er1–Erm to the respective output leads of the drive IC. Likewise, the conductive films Cr1–Crm have the forms, which allow connection of lead electrodes on the junction substrate, which is to be connected to the substrate Sr, to the respective input leads of the drive IC. The number of the conductive films corresponds to the number of the input leads of the drive IC.

Similarly to the substrate Sc shown in FIG. 4(B), formed on the substrate Sc shown in FIG. 7(B) are the belt-like electrodes Ec1–Ecn and the metal films Mc1–Mcn electrically connected to these respective belt-like electrodes. These metal films Mc1–Mcn are to be connected to the output leads of the drive IC 81c. Conductive films Cc1–Ccn, which are to be connected to the input leads of the drive IC 81c, are also formed on the substrate Sc shown in FIG. 7(B). The conductive films Cc1–Ccn in this embodiment are made of the same metal material as the metal films Mc1–Mcn. The metal films Mc1–Mcn have the forms, which allow connection of the belt-like electrodes Ec1–Ecn to the respective output leads of the drive IC. The conductive films Cc1–Ccn likewise have the forms, which allow connection of lead electrodes on the junction substrate, which is to be connected to the substrate Sc, to the respective input leads of the drive IC. The number of the conductive films corresponds to the number of the input leads of the drive IC.

The structure in which the drive ICs are directly mounted on the substrates Sr and Sc can provide the effects similar to those achieved by the structure in which the drive substrates are connected to the substrates Sr and Sc. More specifically, in the case where the drive IC is directly mounted on the display panel substrate, damage and line breakage are liable to occur in the ITO belt-like electrodes if the leads of the drive IC are directly connected to the ITO belt-like electrodes. In particular, if the lead of the drive IC has a bump form, the lead of the bump form may stick into the belt-like electrode, and therefore damage is more likely to occur in the ITO electrode. Further, damage is more likely to occur in the ITO belt-like electrode in the case where the ITO belt-like electrode is formed on the resin substrate than the case where the ITO belt-like electrode is formed on a glass substrate. In contrast to these, the display panel already described can suppress the damage in the ITO belt-like electrodes because the bump form-lead of the drive IC can be connected to the metal film.

Figure 9A:
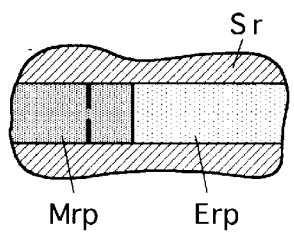
FIG. 9(A) shows an example of connection between an electrode and a metal film.

In the above example, the belt-like electrode (e.g., belt-like electrode Erp) composing the row electrode Er and the metal film (e.g., metal film Mrp) provided for the corresponding belt-like electrode are electrically connected in such a structure that a portion of the metal film Mrp is overlapped with the end portion of the belt-like electrode Erp having the substantially same width as the metal film Mrp, as shown in FIG. 9(A).

Figure 9B:
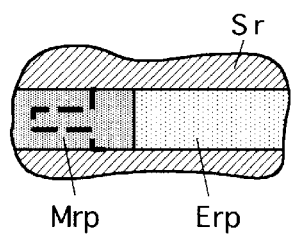
FIGS. 9(B)–9(D) show further examples of the connection between them, respectively.

Instead of the above connection between the belt-like electrode Erp and the metal film Mrp, they may be connected together, e.g., as shown in FIG. 9(B). According to the connection between the electrode Erp and the metal film Mrp shown in FIG. 9(B), the reliability in connection between the electrode Erp and the metal film Mrp can be improved. This is because the adhesion between the metal film Mrp and the resin substrate Sr is relatively high, in contrast to the relatively low adhesion between the ITO electrode Erp and the metal film Mrp.

More specifically, in the connection shown in FIG. 9(B), the end portion of the electrode Erp has a smaller width than the other portion, and the metal film Mrp is overlapped with the electrode Erp to cover the electrode end portion of the small width. In the region around the portion where the metal film Mrp overlaps with the ITO elect rode Erp, the metal film Mrp and the substrate Sr in FIG. 9(B) can be adhered or fixed to each other through a larger area than that in FIG. 9(A). Further, the electrode portion having a small width is covered with the metal film Mrp, which is strongly adhered to the substrate portion around this narrow electrode portion. According to these, the peeling of the metal film Mrp from the ITO electrode Erp can be suppressed. It is difficult to increase the width of the metal film Mrp in view of the neighboring metal film, more specifically in view of insulation with the neighboring metal film. However, by reducing the width of the electrode end portion as described above, the metal film can be arranged on the substrate Sr to cover the electrode.

Figure 9C:
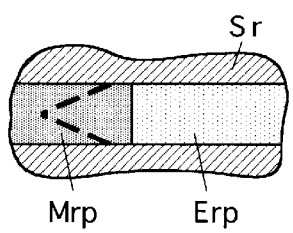
Figure 9D:
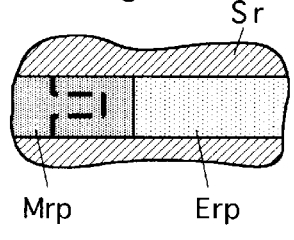

An end portion of the electrode Erp may have a smaller width than the other portion such that the width of this end portion decreases toward the end as shown in FIG. 9(C). As shown in FIG. 9(D), the electrode Erp may be provided at its center of the end portion with a recess. These structures can provide a similar effect to that of FIG. 9(B).

The foregoing structure, which is employed for connecting the belt-like electrodes forming the row electrode Er to the metal films, may also be employed for connecting the belt-like electrodes forming the column electrode Ec to the metal films, which likewise provide a similar effect.

§ 9.

A method of producing the liquid crystal display panel DP1 shown in FIG. 1 will now be described.

(a) Preparing Step

First, the resin substrate Sc for forming the column electrode Ec and others thereon as well as the resin substrate Sr for forming the row electrode Er and others thereon are prepared. In this example, PC films are used as the substrates Sr and Sc.

(b) Electrode Forming Step and Metal Film Forming Step

Figure 10:
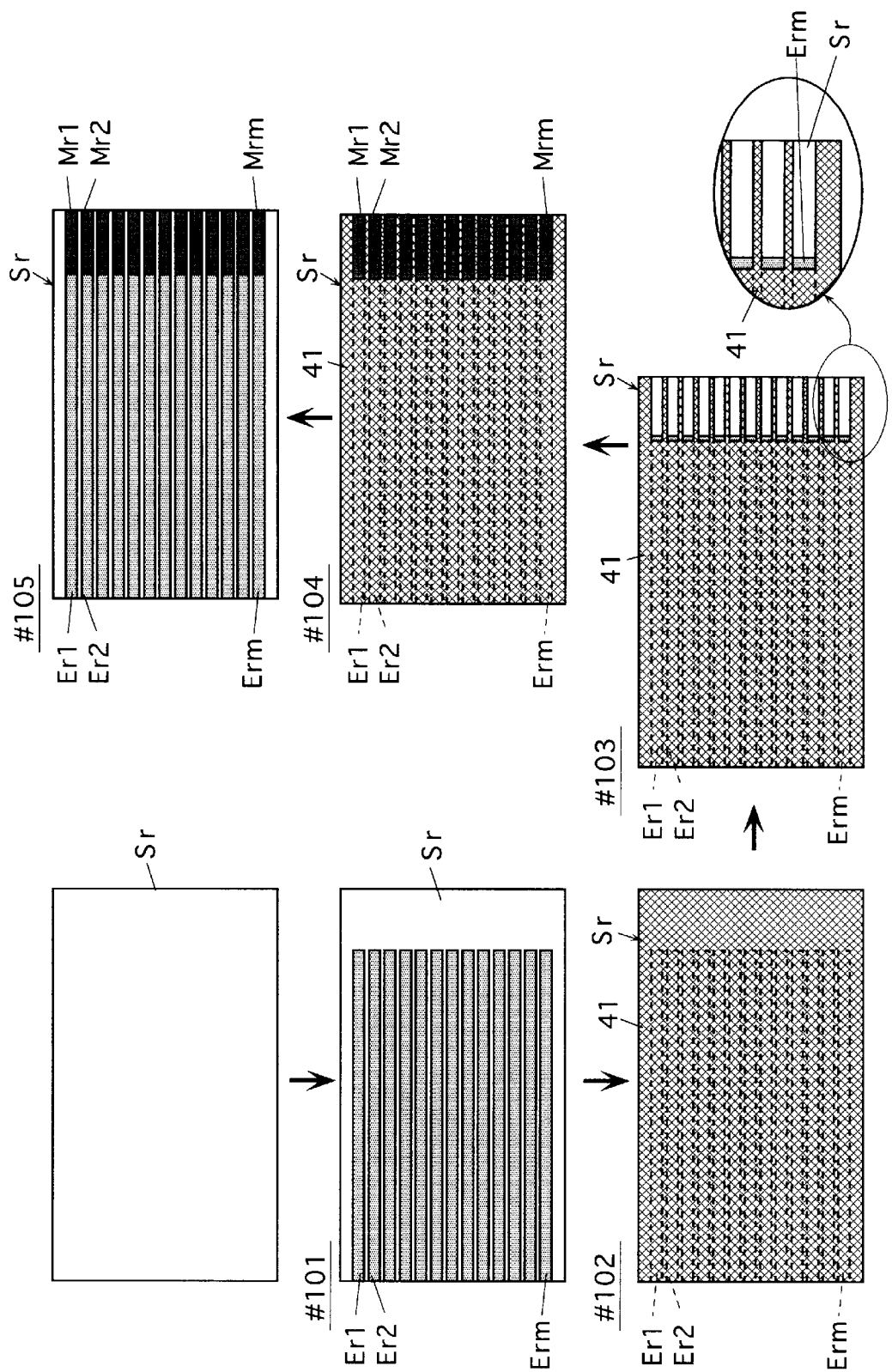
FIG. 10 shows an example of steps of forming a plurality of electrodes of predetermined forms and a plurality of metal films of predetermined forms.

Then, the belt-like electrodes and the metal films are formed on the substrates Sc and Sr in the following manner. Referring to FIG. 10, the manners for forming the belt-like electrode Er1–Erm of the row electrode Er and the metal films Mr1–Mrm on the substrate Sr will be described.

On the substrate Sr, the belt-like electrodes Er1–Erm is first formed, using ITO in this example, to have the predetermined forms or predetermined pattern (step #101 in FIG. 10). In this stage, the belt-like electrodes Er1–Erm of the final form are formed. The row electrode Er of the predetermined form can be formed on the substrate Sr by utilizing known method(s) such as photolithography and etching methods. For example, a solid ITO film is uniformly formed over the whole surface of the substrate Sr, and then a photosensitive resist film is uniformly formed over the solid ITO film. Then, the resist film is exposed to light through a mask having apertures of the pattern (positive pattern), which corresponds to the pattern of the electrodes the formed. Then, the resist film other than the exposed resist film portion is removed. Thereafter, the etching is effected on the ITO film portion not covered with the resist film so that the belt-like electrodes of the row electrode Er having the predetermined form are formed.

Then, a resist film 41 is formed over the whole surface of the substrate Sr carrying the row electrode Er (#102).

Then, portions of the resist film 41 corresponding to substrate regions, on which the metal films Mr1–Mrm are to be formed, are removed to expose these substrate regions without hidden by the resist film 41 (#103). For overlapping the metal films Mr1–Mrm, which will be formed in the later step, with the respective end portions of the belt-like electrodes Er1–Erm, the end portions of the belt-like electrodes Er1–Erm are also exposed.

Then, electroless plating is effected on the substrate Sr to form the metal films Mr1–Mrm using the resist film 41 thus patterned as a mask (#104). Since the end portions of the belt-like electrodes Er1–Erm are not covered with the mask, portions of the metal films Mr1–Mrm overlap with the respective end portions of the electrodes Er1–Erm, and the other portions of the metal films Mr1–Mrm are formed directly on the substrate Sr.

Thereafter, the resist film 41 is removed: (#105).

Through the above steps, achieved is the substrate Sr on which the belt-like electrodes Er1–Erm of the predetermined forms and the metal films Mr1–Mrm of the predetermined forms are formed.

On the other substrate Sc, the belt-like electrodes Ec1–Ecn forming the column electrode Ec and the metal films Mc1–Mcn are formed through similar steps.

(c) Insulating Film Forming Step and Stabilizing Film Forming Step

Then, the insulating film IS2 and the stabilizing film ST2 are successively formed on the substrate Sr carrying the belt-like electrodes Er1–Erm and the metal films Mr1–Mrm. Also, the insulating film IS1 and the stabilizing film ST1 are successively formed on the substrate Sc carrying the belt-like electrodes Ec1–Ecn and metal films Mc1–Mcn.

(d) Resin Structure Forming Step

Then, the resin structures 4 are formed on at least one of the substrates Sc and Sr. In this embodiment, the resin structures 4 are formed on the substrate Sc.

The resin structure may be made of a material, which is softened by heating, and is hardened by cooling. Preferable material for the resin structure is an organic material which does not react with the liquid crystal material to be used, and has an appropriate elasticity.

The resin structures may be formed in a printing method in which a paste material containing resin (e.g., resin dissolved in solvent) is applied onto the substrate by a sqeezee through a screen or a metal mask. The resin structures may be formed by applying resin from a nozzle onto the substrate in a dispenser method or an ink-jet method. The resin structures may be formed in a transfer method in which resin is supplied onto a flat plate or a roller, and then is transferred onto the substrate. In this stage, each of the resin structures preferably has a height larger than the intended thickness of the liquid crystal layer for fixing the substrates together by the resin structures in the later step.

(e) Spacer Dispersing Step

Then, the spacers 3 are dispersed on at least one of the substrates Sc and Sr. In this embodiment, the spacers 3 are dispersed on the substrate Sc.

The spacers are preferably formed of particles of a hard material which is not deformed by heat and pressure.

The spacers may be dispersed on the substrate in an appropriate method such as a wet dispersion method or a dry dispersion method.

(f) Sealing Wall Forming Step

Then, sealing wall SW is formed on one of the substrates Sc and Sr. In this example, the sealing wall SW is formed on the substrate Sc.

The sealing wall SW may be made of resin such as UV-curing resin or thermosetting resin.

The sealing wall may be formed in a dispenser method or an ink-jet method in which resin is applied from a nozzle onto the substrate. The sealing wall may be formed in a printing method using a screen, a metal mask or the like. The sealing wall may be formed in a transfer method in which resin is supplied onto a flat plate or a roller, and then is transferred onto the substrate.

The resin structure forming step, the spacer dispersing step and the sealing wall forming step may be performed in any order.

(g) Substrate Joining Step

Figure 11:
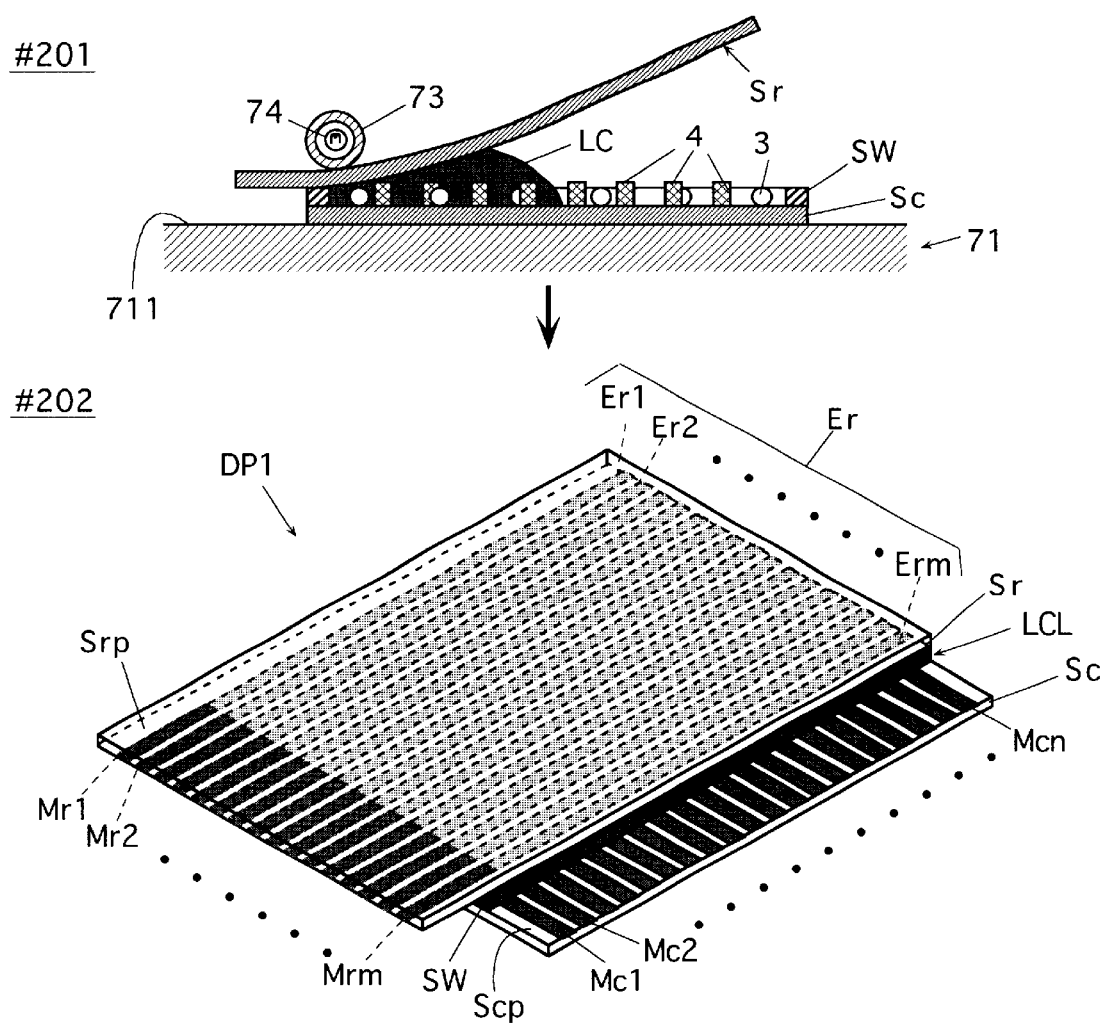
FIG. 11 shows an example of steps of adhering the substrates together to form a liquid crystal display panel.

Then, the liquid crystal LC is dropped onto the region on the substrate Sc surrounded by the sealing wall SW, and the substrates Sc and Sr are joined or adhered together with the liquid crystal LC therebetween (step #201 in FIG. 11).

More specifically, the substrate Sc is first laid on a plane 711 of a holding member 71.

Then, the liquid crystal LC is dropped onto the end region on the substrate Sc surrounded by the sealing wall SW.

Then, only one end of the substrate Sr is laid over the substrate Sc with the liquid crystal LC therebetween. In this stage, the substrate Sr is curved so that the other end portion of the substrates Sr is spaced from the substrate Sc. Since the substrate Sr is the resin film having the flexibility, the substrate Sr can be curved or bent as described above.

Then, a roller 73, which is internally provided with a heater 74, pushes a portion of the substrate Sr toward the substrate Sc while moving the pushed portion from one end portion of the substrate Sr toward the other end portion. The roller 73 may be moved, or the substrates may be moved.

Thereby, the substrates Sc and Sr are overlaid together while pushing and spreading the liquid crystal LC. The resin structures 4 and the sealing wall SW are melded to adhere to the substrates Sc and Sr by the heat of the heater 74, so that the substrates are joined together. By moving the overlaid portions of the substrates from one end portion to the other end portion while spreading the liquid crystal LC, it is possible to prevent mixing of bubbles into the liquid crystal. The spacers 3 determine the thickness of the liquid crystal to an intended value. Instead of dispersing the spacers over the substrate before overlaying the substrates together, the spacers may be dispersed within the liquid crystal to be supplied onto the substrate.

Through the above steps, achieved is the display panel DP1, in which the liquid crystal layer LCL is held between the substrates Sc and Sr (#202).

Instead of the above, the liquid crystal may be filled into the space defined by the substrates and the sealing wall in a vacuum filling method after joining the substrates. In this case, the sealing wall may be provided with an inlet for filling the liquid crystal into that space, and this inlet may be closed by a sealing agent after filling the liquid crystal into that space.

§ 10.

The electrode forming step and the metal film forming step may be performed as described below.

Figure 12:
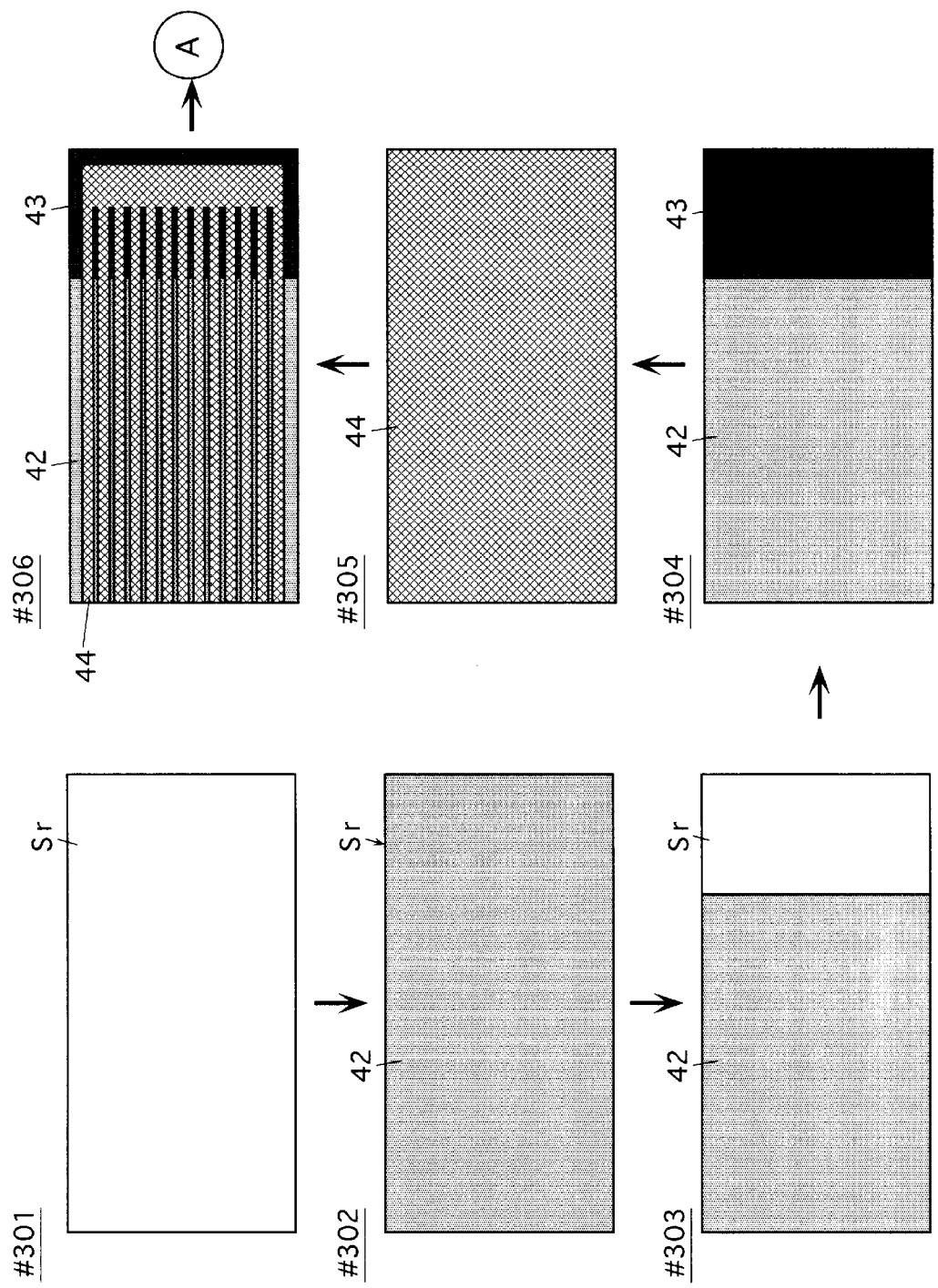
FIGS. 12 and 13 show another example of the steps of forming a plurality of electrodes of predetermined forms and a plurality of metal films of predetermined forms.
Figure 13:
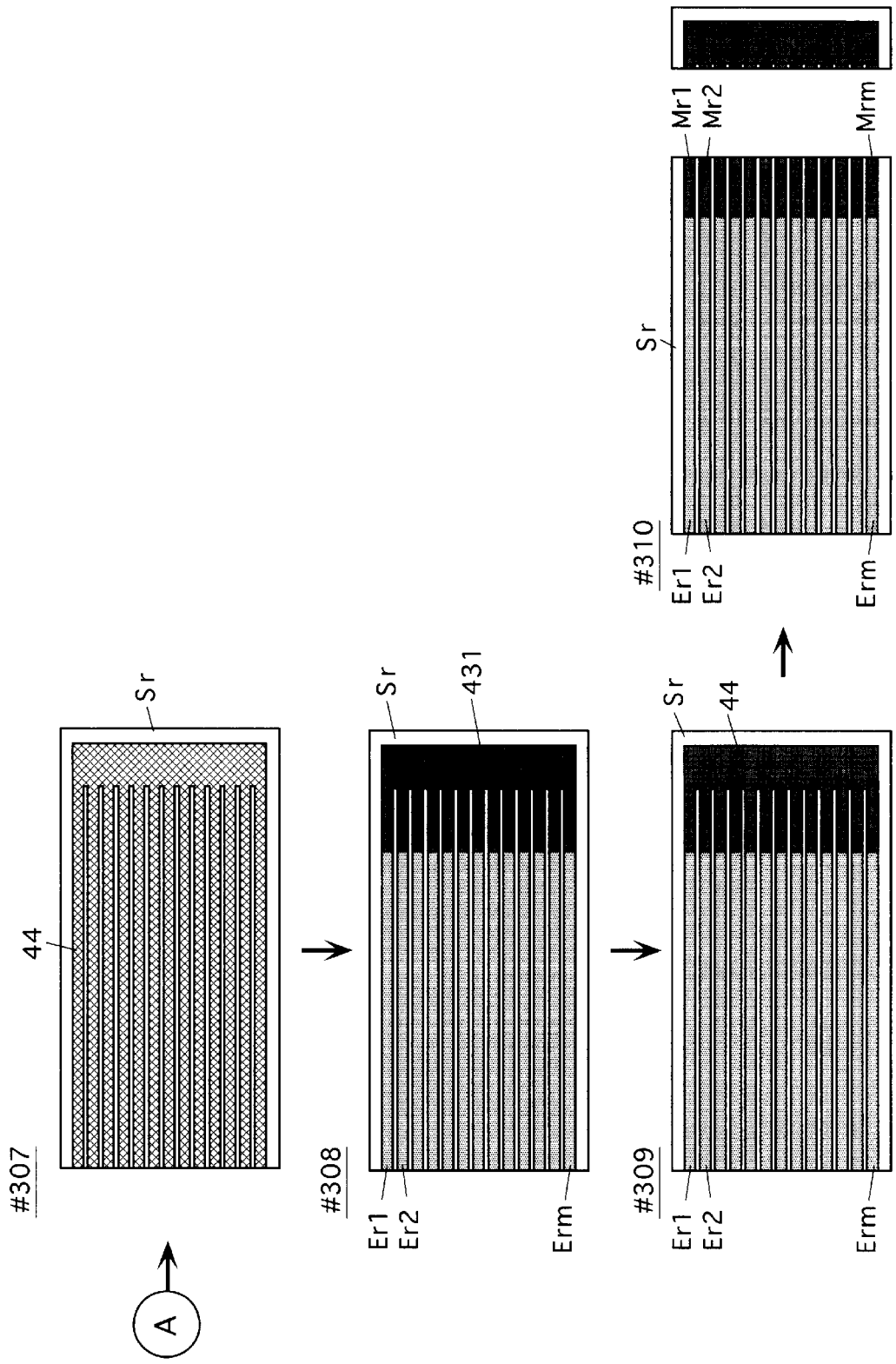

Referring to FIGS. 12 and 13, description will be given on the steps of forming the belt-like electrodes Er1–Erm and the metal films Mr1–Mrm on the substrate Sr.

First, a resin substrate Sr is prepared (#301). In this stage, the resin substrate Sr has a larger size than the final substrate Sr, since a portion of the substrate Sr will be cut off in the later step.

Then, an electrode material film (ITO film 42 in this embodiment) is formed on the whole surface of the substrate Sr (#302). Thus, a solid or full ITO film 42 is formed over the whole surface of the substrate Sr.

Then, a portion of the solid ITO film 42 corresponding to the substrate region, where the belt-like electrodes Er1–Erm are not to be formed, is removed (#303). Thereby, the solid ITO film 42 is left only on the substrate region including a region, where the belt-like electrodes Er1–Erm are to be formed. Instead of the above, the solid ITO film may be formed, from beginning, only on the substrate region including the region, where the belt-like electrodes Er1–Erm are to be formed, by using a mask.

Then, a solid metal film 43 is formed on a substrate region including a substrate region portion where the metal films Mr1–Mrm are to be formed, as well as the substrate region portion where a connection metal film for electrically connecting the metal films Mr1–Mrm is to be formed (#304). The solid metal film 43 may be formed by electroless plating or sputtering.

Then, a resist film 44 is formed over the whole surface of the substrate Sr carrying the solid ITO film 42 and the solid metal film 43 (#305).

Then, portions of the resist film 44 on the substrate regions other than the regions where the belt-like electrodes Er1–Erm, the metal films Mr1–Mrm and the connection metal film for electrically connecting the metal films Mr1–Mrm are to be formed are removed (#306).

Then, portions, not covered with the resist film 44, of the solid ITO film 42 as well as portions, not covered with the resist film 44, of the solid metal film 43 are removed by etching (step #307 in FIG. 13). Then, the resist film 44 is removed (#308)

Through the above steps, formed on the substrate Sr are the belt-like electrodes Er1–Erm each having the final form, which have been formed by etching the solid ITO film 42 to pattern it into the predetermined form. On the substrate Sr, a metal film 431 is also formed by etching and patterning the solid metal film 43. The metal film 431 is composed of metal film portions to be the metal films Mr1–Mrm: of the final forms as well as the connection metal film portion electrically connecting the metal films Mr1–Mrm.

Figure 14:
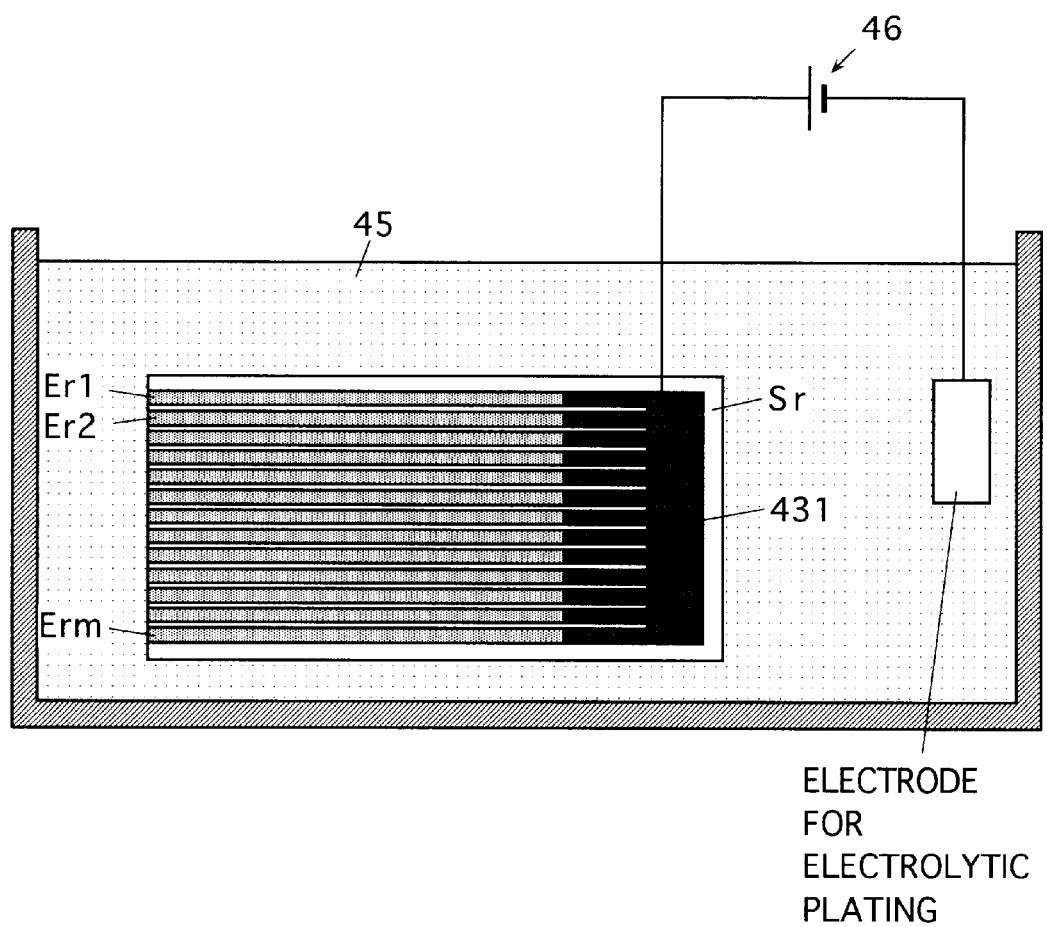
FIG. 14 shows a manner of effecting electrolytic plating on a metal film formed on the substrate.

Then, a metal film 44 is formed on the metal film 431 by electrolytic plating (#309). More specifically, as shown in FIG. 14, the substrate Sr carrying the metal film 431 and others is immersed in plating solution (electrolytic solution) 45. The metal film 431 is used as one of paired electrodes for the electrolytic plating. Thereby, the metal film 44 is formed by the plating only on the metal film 431. The plating does not form a metal film on the ITO electrodes Er1–Erm because the ITO has a large electrical resistance. Since the metal film 431 has the metal film portion for electrically connecting the portions to be the metal films Mr1–Mrm as already described, it is not necessary to connect each of the metal films Mr1–Mrm to a power source 46 independently of the others. This simplifies the electrolytic plating processing.

Thereafter, the substrate portion carrying the connection metal film, which electrically connects the metal films Mn1–Mrm, is cut off (#310)

Through the above steps, achieved is the substrate Sr on which the belt-like electrodes Er1–Erm of the predetermined forms as well as the metal films Mr1–Mrm of the predetermined forms. Each metal film has a two-layer structure having the metal film formed in the step #304 and the metal film formed in the step #309 layered together.

§ 11.

The method of producing the display panel described above can be used not only for producing the display panel DP1 shown in FIG. 1 but also for producing the display panel DP2 shown in FIG. 8.

In producing of the display panel DP2, the conductive films Cc1–Ccn and Cr1–Crm, which are to be connected to the input leads of the drive ICs, may be made of the same material as the metal film in the same manner as it.

§ 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A display panel comprising:
   a display layer for performing display;
   a flexible substrate for holding or carrying the display layer;
   a transparent electrode formed on the flexible substrate; and
   a metal film formed on the flexible substrate, electrically connected to the transparent electrode and made of a material different from that of the transparent electrode.

2. A display panel according to claim 1, wherein a first portion of the metal film is overlapped with an end portion of the transparent electrode, and a second portion of the metal film is formed on a portion of the flexible substrate not carrying the transparent electrode.

3. A display panel according to claim 2, wherein at least a portion of the end portion of the transparent electrode has a smaller width than the second portion of the metal film, and is covered with the metal film.

4. A display panel according to claim 2, further comprising a second substrate and a sealing wall, wherein the display layer is arranged between the flexible substrate and the second substrate;
   the sealing wall is arranged between the flexible substrate and the second substrate, and surrounds the display layer; and
   the sealing wall covers the portions, overlapping with each other, of the transparent electrode and the metal film.

5. A display panel according to claim 2, wherein the second portion of the metal film is at least partially formed on an end portion of the flexible substrate.

6. A display panel according to claim 1, wherein the metal film is formed by plating.

7. A display panel according to claim 1, wherein the metal film has a thickness not impeding flexibility of the flexible substrate carrying the metal film.

8. A display panel according to claim 1, wherein the metal film has a thickness in a range from 1 $\mu$m to 10 $\mu$m.

9. A display panel according to claim 1, wherein the display layer is a liquid crystal layer containing a liquid crystal.

10. A display panel according to claim 1, wherein the flexible substrate is a resin film substrate.

11. A display panel according to claim 1, wherein the transparent electrode is made of ITO.

12. A display panel according to claim 1, wherein the metal film is made of gold, copper, chromium, nickel or aluminum.

13. A display panel according to claim 1, wherein the metal film is used for electrically connecting the transparent electrode to a drive element provided for driving the display panel.

14. A display panel according to claim 1, wherein a drive element is mounted on the flexible substrate, and has a lead electrically connected to the transparent electrode via the metal film.

15. A display panel according to claim 1, wherein a drive substrate carrying a drive element is connected to the flexible substrate, and a lead of the drive element is electrically connected to the transparent electrode via the metal film.

16. A method of producing a display panel comprising:
    an electrode forming step of forming a transparent electrode of a predetermined form on a flexible substrate;
    a metal film forming step of forming a metal film of a predetermined form on the flexible substrate so that the metal film is electrically connected to the transparent electrode, the metal film being made of a material different from that of the transparent electrode; and
    a step of holding or carrying a display layer with the flexible substrate carrying the transparent electrode and the metal film, the display layer being provided for performing display.

17. A producing method according to claim 16, wherein the metal film is formed by plating in the metal film forming step.

18. A producing method according to claim 16, wherein the electrode forming step and the metal film forming step include the steps of:
    (a) forming the transparent electrode of the predetermined form on the flexible substrate;
    (b) forming a mask on the flexible substrate carrying the transparent electrode so that a region, onto which the metal film is to be formed, of the flexible substrate is exposed without being hidden by the mask;
    (c) forming the metal film on the flexible substrate through the mask to form the metal film of the predetermined form; and
    (d) removing the mask.

19. A producing method according to claim 16, wherein the electrode forming step and the metal film forming step include the steps of:
    (a) forming a solid electrode material film made of a material of the transparent electrode over a first region of the flexible substrate, the first region including a region onto which the transparent electrode of the predetermined form is to be formed;
    (b) forming a solid first metal film over a second region of the flexible substrate carrying the solid electrode material film, the second region including a region onto which the metal film of the predetermined form is to be formed;
    (c) forming a mask on the flexible substrate carrying the solid electrode material film and the solid first metal film so that a region of the flexible substrate except for a third region is exposed without being hidden by the mask, the third region including the region onto which the transparent electrode of the predetermined form is to be formed and the region onto which the metal film of the predetermined form is to be formed;
    (d) removing a portion, not covered with the mask, of the solid electrode material film and a portion, not covered with the mask, of the solid first metal film to form the transparent electrode of the predetermined form and the first metal film of the predetermined form on the flexible substrate; and
    (e) removing the mask.

20. A producing method according to claim 19, wherein the electrode forming step and the metal film forming step further include a step of forming a second metal film on the first metal film of the predetermined form after removing the mask.

21. A producing method according to claim 20, wherein the second metal film is formed by electrolytic plating.

* * * * *